United States Patent [19]

Araki

[11] Patent Number: 5,589,699
[45] Date of Patent: Dec. 31, 1996

[54] ELECTRICALLY ERASABLE PROGRAMMABLE NON-VOLATILE SEMICONDUCTOR MEMORY DEVICE HAVING SELECT GATES AND SMALL NUMBER OF CONTACT HOLES

[75] Inventor: Hitoshi Araki, Yokohama, Japan

[73] Assignee: Kabushiki Kaisha Toshiba, Kawasaki, Japan

[21] Appl. No.: 359,660

[22] Filed: Dec. 20, 1994

[30] Foreign Application Priority Data

Dec. 27, 1993 [JP] Japan .................... 5-348512
Jun. 30, 1994 [JP] Japan .................... 6-150242
Nov. 11, 1994 [JP] Japan .................... 6-277470

[51] Int. Cl.$^6$ ........................... H01L 29/788
[52] U.S. Cl. ............. 257/316; 257/326; 365/185.17
[58] Field of Search ................. 365/185.17, 185.1, 365/185.27; 257/316, 315

[56] References Cited

U.S. PATENT DOCUMENTS

| | | | |
|---|---|---|---|
| 4,233,526 | 11/1980 | Kurogi et al. | 307/238 |
| 4,371,956 | 2/1983 | Maeda et al. | 365/185 |
| 4,437,172 | 3/1984 | Masuoka | 365/182 |
| 4,580,247 | 4/1986 | Adam | 365/200 |
| 4,933,904 | 6/1990 | Stewart et al. | 365/195 |
| 4,959,812 | 9/1990 | Momodomi et al. | 257/316 |
| 4,962,481 | 10/1990 | Choi et al. | 365/185 |
| 5,043,942 | 8/1991 | Iwata et al. | 365/185 |
| 5,172,198 | 12/1992 | Aritome et al. | 257/315 |
| 5,179,427 | 1/1993 | Nakayama et al. | 257/211 |
| 5,319,593 | 6/1994 | Wolstenholme | 365/185 |
| 5,392,238 | 2/1995 | Kirisawa | 365/185.17 |

FOREIGN PATENT DOCUMENTS

| | | |
|---|---|---|
| 0322900A3 | 7/1989 | European Pat. Off. . |
| 0365720 | 5/1990 | European Pat. Off. . |
| 0419663A1 | 4/1991 | European Pat. Off. . |
| 57-71587 | 5/1982 | Japan . |
| 60-182162 | 9/1985 | Japan . |
| 61-113272 | 5/1986 | Japan . |

OTHER PUBLICATIONS

Aritome et al., "A 1.13$\mu m^2$ Memory Cell Technology for Reliable 3.3V 64M NAND EEPROMs", International Conference on Solid State Devices and Materials, 29 Aug. 1993, pp. 446–448.

Adler, *Densely Arrayed EEPROM Having Low–Voltage Tunnel Write*, IBM® Technical Disclosure Bulletin, vol. 27, No. 6, Nov. 1984.

*Primary Examiner*—Robert P. Limanek
*Attorney, Agent, or Firm*—Banner & Witcoff, Ltd.

[57] ABSTRACT

The structure of the invention employs a lamination type memory cell and a lamination type select transistor having a floating gate. Since no contact holes are formed in a first polysilicon film of a high resistance, it is not necessary to form a contact hole in the gate wire of the select transistor between a cell array. A floating gate is beforehand charged with electricity so that the select transistor cab have a positive threshold value. Alternatively, an impurity is introduced into the channel region of the select transistor so that the neutral threshold voltage of the transistor after radiation of ultraviolet rays can have a positive value.

52 Claims, 20 Drawing Sheets

| | READING | ERASING | WRITING |
|---|---|---|---|
| BL | PRECHARGE | OPEN | "0" WRITING 0V<br>"1" WRITING 10V |
| SG1 | 5 V | 20 V | 10 V |
| CG | SELECTED 0V<br>NON-SELECTED 5V | 0 V | SELECTED 20V<br>NON-SELECTED 10V |
| SG2 | 5 V | 20 V | 0 V |
| W | 0 V | 20 V | 0 V |
| S | 0 V | OPEN | 0 V |

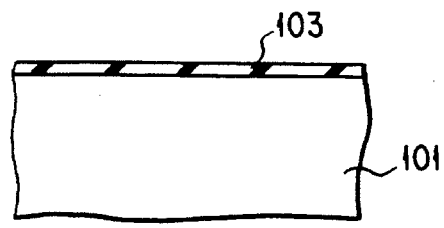
F I G. 5B
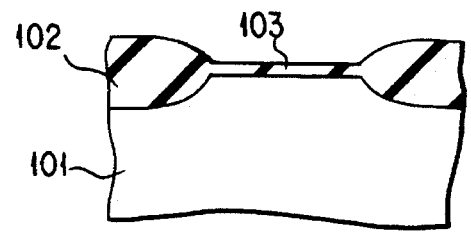
F I G. 6B
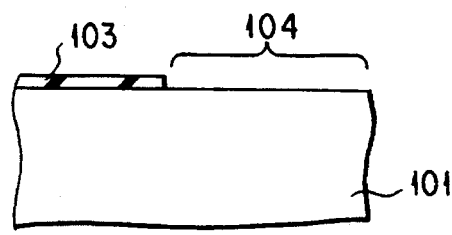
F I G. 5C
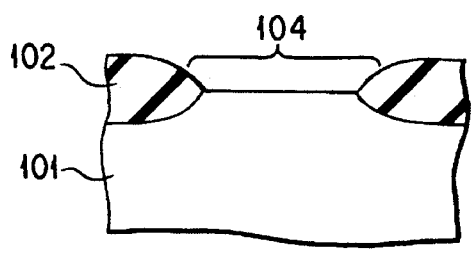
F I G. 6C
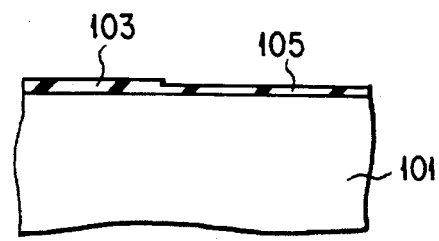
F I G. 5D
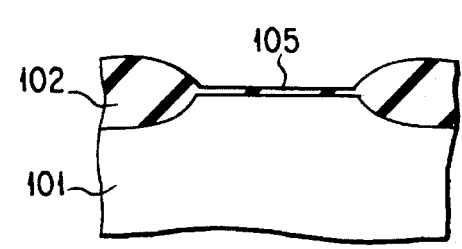
F I G. 6D
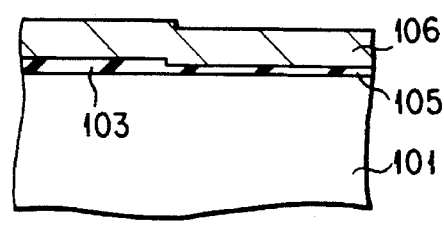
F I G. 5E
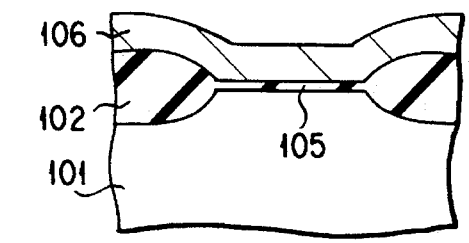
F I G. 6E

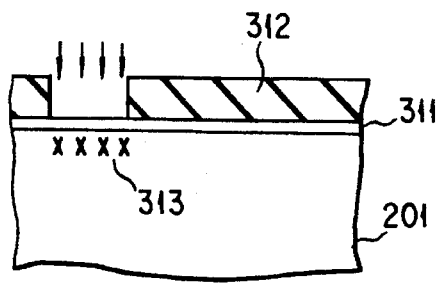
F I G. 10K
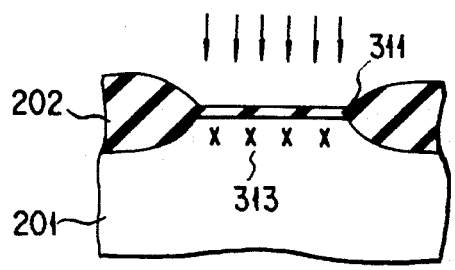
F I G. 11K
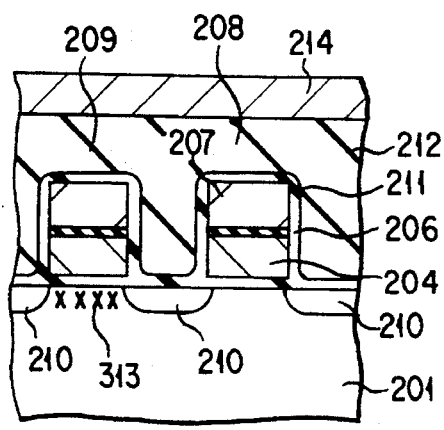
F I G. 10L
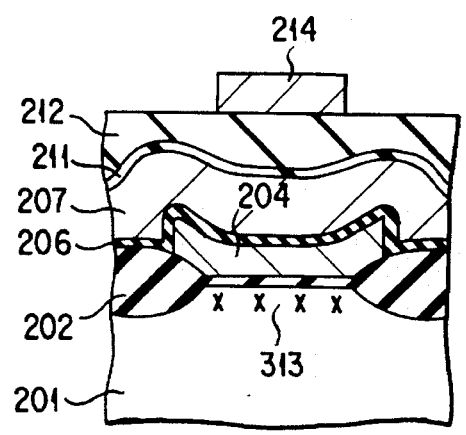
F I G. 11L
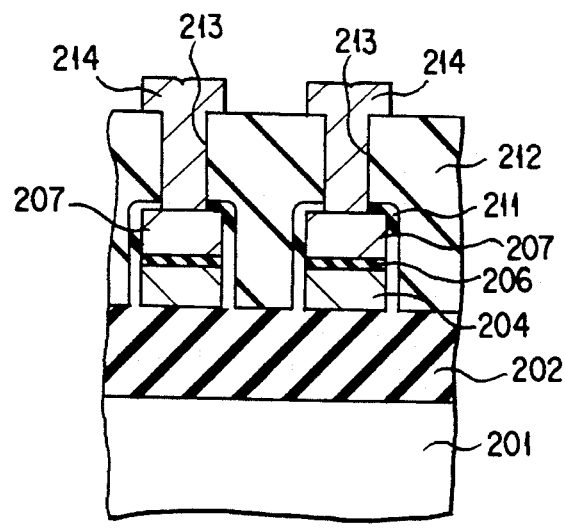
F I G. 12B

|  | AT READING | AT WRITING | AT SG WRITING | AT ERASING |
|---|---|---|---|---|
| SIGNAL A | Vcc | Vcc | GND | GND |
| SIGNAL B | GND | GND | Vcc | Vcc |
| SIGNAL C | GND | GND | GND | Vpp |
| SIGNAL D | Vcc | GND | GND | GND |
| SIGNAL E | GND | Vcc | GND | GND |
| POWER SUPPLY $V_A$ | Vcc | Vpp | Vpp | Vpp |
| POWER SUPPLY $V_B$ | Vcc | Vm | Vcc | Vcc |
| POWER SUPPLY $V_C$ | Vcc | Vcc | Vcc | Vpp |
| POWER SUPPLY $V_D$ | Vcc | Vpp | Vpp | GND |

|  | READING | ERASING | WRITING |
|---|---|---|---|
| BL | 5V PRECHARGE | OPEN | "0"WRITING 0V<br>"1"WRITING 10V |
| SG1 | 5V | 20V OR 10V | 10V |
| CG | SELECTED 0V<br>NON-SELECTED 5V | 0V | SELECTED 20V<br>NON-SELECTED 10V |
| SG2 | 5V | 20V OR 10V | 0V |
| W | 0V | 20V | 0V |
| S | 0V | OPEN | 0V |
F I G. 21
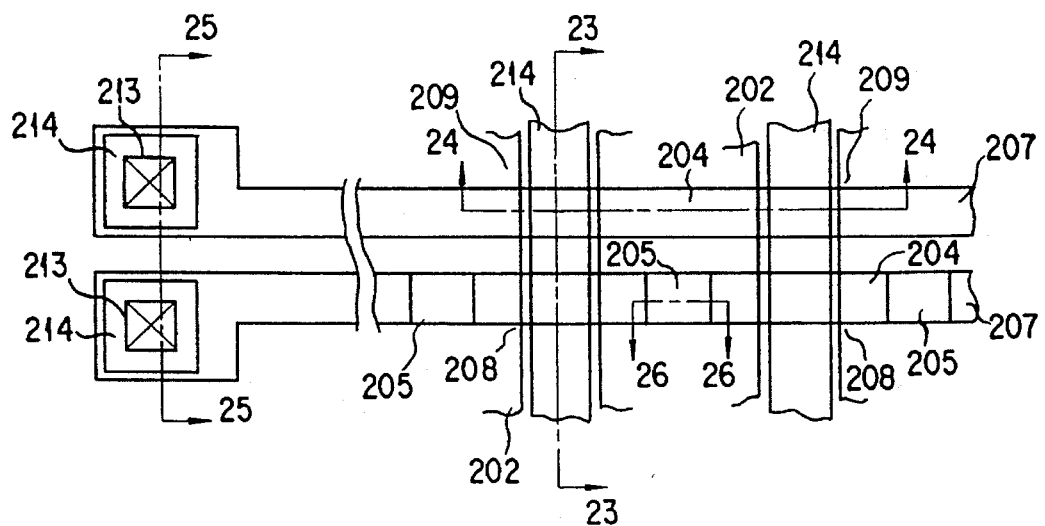
F I G. 22

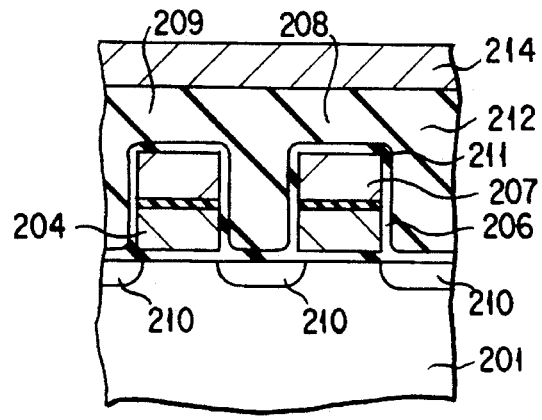
F I G. 23
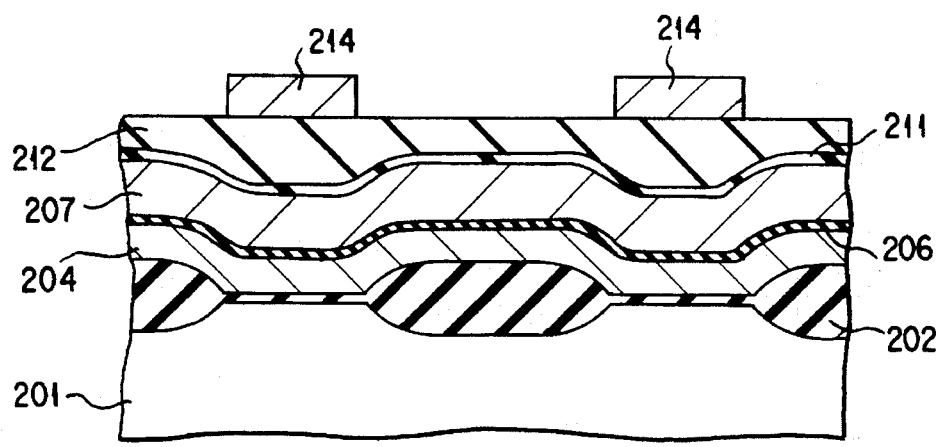
F I G. 24
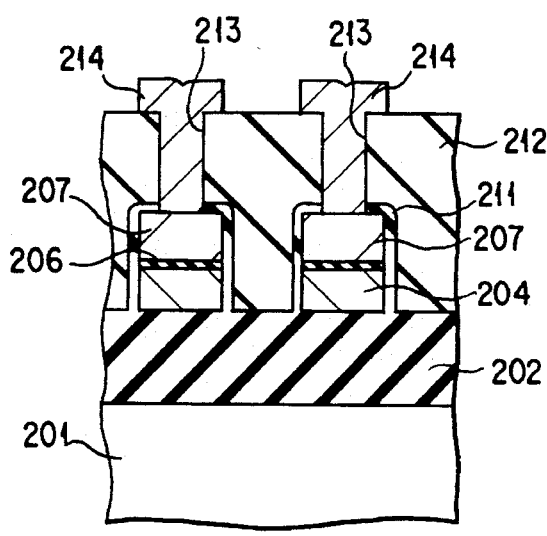
F I G. 25
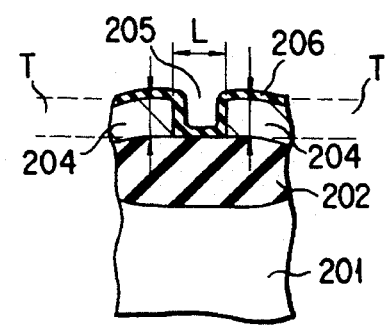
F I G. 26

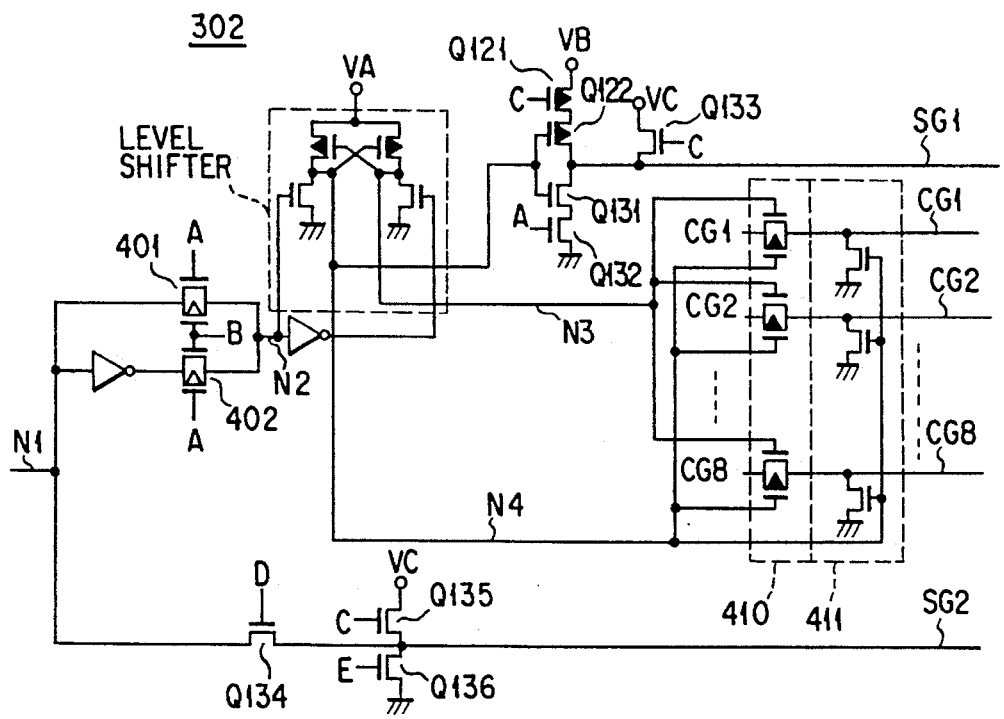

P-CHANNEL MOS TRANSISTOR HAVING WELL POTENTIAL OF Vcc DURING READING, OF Vpp DURING WRITING/ERASING

P-CHANNEL MOS TRANSISTOR HAVING WELL POTENTIAL OF Vcc

FIG. 27

|  | AT READING | AT WRITING | AT ERASING |
|---|---|---|---|
| SIGNAL A | Vcc | Vcc | GND |
| SIGNAL B | GND | GND | Vcc |
| SIGNAL C | GND | GND | Vpp |
| SIGNAL D | Vcc | GND | GND |
| SIGNAL E | GND | Vcc | GND |
| POWER SUPPLY $V_A$ | Vcc | Vpp | Vpp |
| POWER SUPPLY $V_B$ | Vcc | Vm | Vcc |
| POWER SUPPLY $V_C$ | Vcc | Vcc | Vpp |

FIG. 28

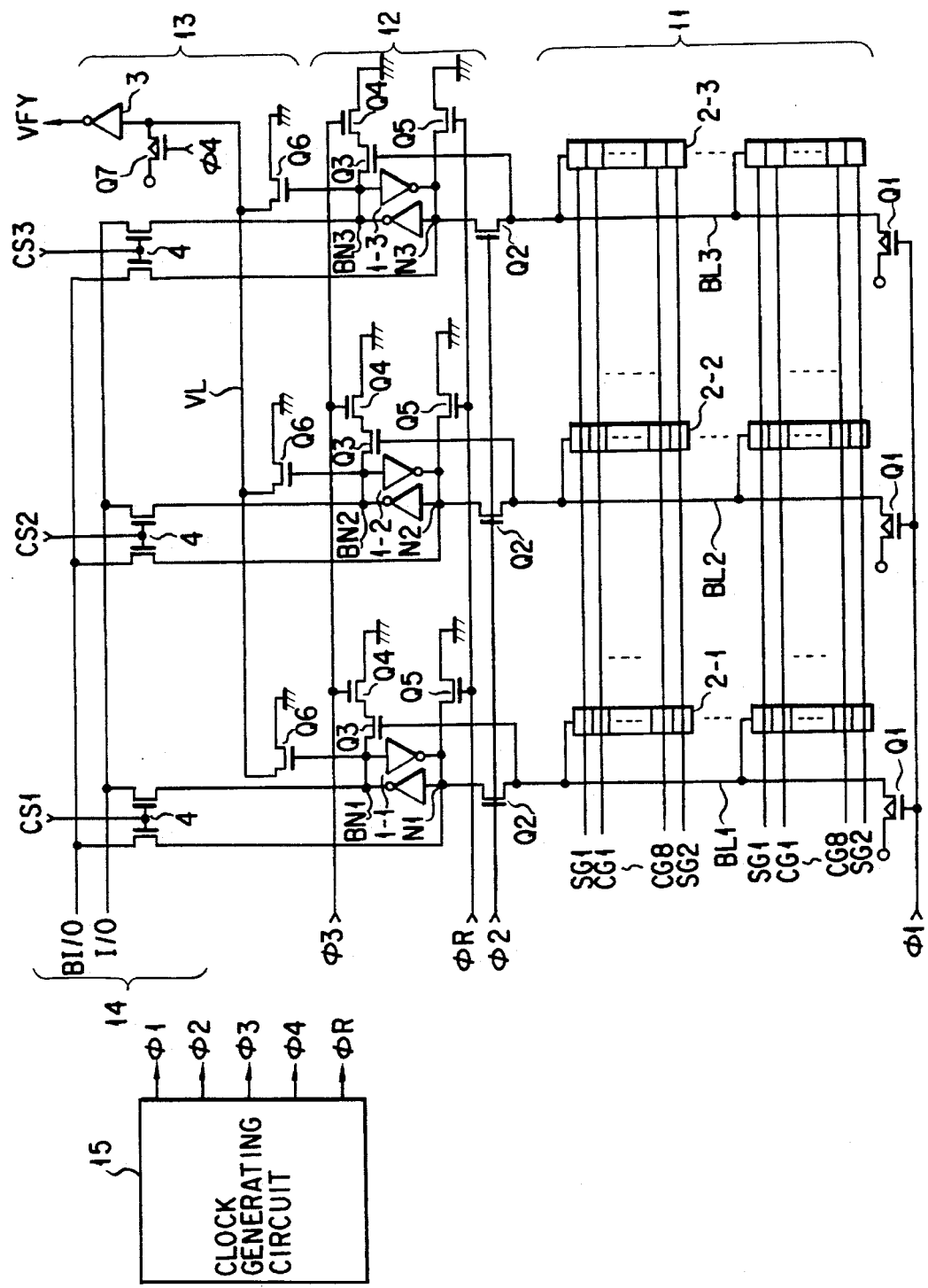
F I G. 32

5,589,699

ELECTRICALLY ERASABLE PROGRAMMABLE NON-VOLATILE SEMICONDUCTOR MEMORY DEVICE HAVING SELECT GATES AND SMALL NUMBER OF CONTACT HOLES

BACKGROUND OF THE INVENTION

1. Field of the Invention

This invention relates to an electrically erasable programmable non-volatile semiconductor memory device, and also to a method of manufacturing the device.

2. Description of the Related Art

Electrically erasable programmable non-volatile semiconductor memory devices include a NAND type EEPROM and a FLOTOX (floating gate tunnel oxide) type EEPROM, which have select transistors, and a NOR type EEPROM with no select transistor. In the EEPROMs with select transistors, the state of each memory cell is determined depending upon whether it has a positive threshold voltage or a negative threshold voltage. Therefore, if there are no select transistors, a cell current will be flown into the non-selected cell, resulting in erroneous operation, where a memory cell having a negative threshold voltage is used as a non-selected cell. To avoid this, select transistors are connected to memory cells in series.

FIG. 1 is a circuit diagram, showing part of a memory cell array employed in the conventional NAND type EEPROM. As is shown in FIG. 1, there are provided lamination type memory cells 191 (hereinafter referred to also as "cells") connected in series and controlled by control gates CG1–CG8. Select transistors 192 are connected to the opposite ends (i.e., the drain side D and the source side S) of the series circuit of the memory cells, respectively, so as to control bit lines BL1 and BL2 with the use of select gates SG1 and SG2. FIG. 2 is a table indicating examples of voltage applied when erasing, writing and reading are performed in a memory cell.

At the time of erasing, a bit line BL and a source S are opened, all the control gates CG are biased to 0 V, and an erasing voltage VEE of, for example, 20 V is applied to a substrate W and select gates SG1 and SG2, thereby drawing electrons from all floating gates by the use of tunnel phenomenon in the oxide film. As a result, the threshold voltages of all the cells are reduced to 0 V or less, in other words, the cells are set in a normally-on state (=a depletion state; a "data 1" state).

At the time of writing, a writing voltage Vpp of, for example, 20 V is applied to the control gate CG of a selected cell, and an intermediate voltage Vm between Vpp and 0 V, for example, 10 V is applied to the control gates CG of a non-selected cell. In this state, 0 V is applied to that one of the bit lines which is connected to the cell in which data "0" is to be written, and Vm is applied to that one of the bit lines which is connected to the cell in which data "1" must be kept.

In the above-described potential state, in the selected cell having its control gate supplied with Vpp and its bit line supplied with 0 V, the voltage Vpp is divided at the ratio (Cs2/(Cs1+Cs2)), hereinafter called a "coupling ratio", of an electrostatic capacitance (Cs2) between the floating gate and the control gate to the sum of an electrostatic capacitance (Cs1) between the floating gate and the semiconductor substrate and the electrostatic capacitance (Cs2). For example, in the case of Cs2/(Cs1+Cs2)=0.5, the potential difference between the floating gate and the semiconductor substrate is 10 V. In this case, the intensity of the electric field applied to the gate oxide film (hereinafter called a "tunnel oxide film") formed between the floating gate and the semiconductor substrate is 10 MV/cm where the tunnel oxide film has a thickness of 10 nm. In this state, a Fowler-Nordheim current (hereinafter called a "tunnel current") flows through the tunnel oxide film, and electrons flow into the floating gate. As a result, the threshold voltage of the cell becomes positive, thus writing data of "0" into the selected cell.

The potential Vm is applied to the control gates of the non-selected cells contained in a NAND ("NAND" indicates a memory cell unit formed by connecting in series the cells which are arranged between the select gates SG1 and SG2) in which the cell (which has, for example, a control gate CG4 and is connected to a bit line BL1) into which data "0" is to be written is included, and in other NANDs connected to the bit line BL1. This is done for turning on the non-selected cell transistors, to apply the bit line potential of 0 V to the channels of the selected cell and provide the selected cell with sufficient writing characteristics. At this time, writing is not performed since the intensity of the electric field applied to the tunnel oxide film of each non-selected cell is about 5 MV/cm. On the other hand, at the time of writing data "1" into a cell (which has, for example, the control gate CG4 and is connected to a bit line BL2) which uses the same control gate as the above-described selected cell, the potential of the bit line BL2 is set to Vm. In this state, no writing is performed and the data of "1" is kept in the cell (CG4, BL2) since substantially Vm is applied to the channel of the cell. The threshold voltage of the cell into which data is to be written is set to a value higher than 0 V and lower than Vcc (e.g. 5 V).

At the time of reading data, a bit line connected to a selected cell is precharged with Vcc (e.g. 5 V), while a bit line connected to a non-selected cell is precharged with 0 V. Further, 0 V is applied to the control gate of the selected cell and Vcc is applied to that of the non-selected cell. In this state, the select transistors (192) are turned on to determine whether the selected cell has data "0" or "1", depending upon whether or not a current flow therein through the bit line. If the cell is in a depletion state, current flows therein, whereas if the cell has a positive threshold voltage, no current flows therein. FIG. 3 shows the electrostatic characteristics of a cell having a threshold voltage higher than 0 V and those of a cell having a threshold voltage lower than 0 V. In FIG. 3, VCG denotes a voltage applied to the control gate of each cell, and Ida drain current thereof.

In general, each memory cell has a sufficiently thin oxide film (tunnel oxide film) of about 10 nm formed between the semiconductor substrate and the charge accumulating region for enabling a tunnel current to flow therein to write or erase data. On the other hand, the gate oxide film of the select transistor must have such a thickness as can prevent a tunnel phenomenon, i.e., as can interrupt a tunnel current, since the transistor must perform a normal operation. If the gate voltage of the select transistor is 10 V during writing, the gate oxide film of the select transistor (SG) must have a thickness of about 30 nm.

An explanation will be given of the steps of manufacturing a semiconductor device in which the gate oxide film of a memory cell has a thickness differing from that of a select transistor.

FIG. 4 is a plan view, showing part of a memory cell array employed in the conventional NAND type EEPROM. FIGS. 5A–5J, FIGS. 6A–6J, FIGS. 7A–7C and FIGS. 8A–8C are views, taken along lines 5—5, 6—6, 7—7 and 8—8 of FIG. 4, respectively.

As is shown in FIGS. 5A and 6A, element-isolating regions 102 are selectively formed in the surface of a semiconductor substrate 101 (FIG. 6A). Then, as is shown in FIGS. 5B and 6B, a first gate oxide film 103 with a thickness of 25 nm is formed on the substrate 101 by thermal oxidation. As is shown in FIGS. 5C and 6C, that part of the first gate oxide film 103 which is located on a memory cell region 104 is removed by photolithography or wet etching (e.g. using $NH_4F$). Subsequently, as is shown in FIGS. 5D and 6D, a second gate oxide film 105 with a thickness of 10 nm is formed by thermal oxidation.

In general, a photosensitive material (resist) used in photolithography contains a metal impurity, which may degrade the quality of the gate oxide films. Forming gate oxide films of different thicknesses without degrading the quality thereof inevitably increases the number of manufacturing steps and makes the manufacturing more complicated.

Thereafter, as is shown in FIGS. 5E and 6E, a first polysilicon film 106 with a thickness of 200 nm is deposited on the gate oxide films 103 and 105. The film 106 is doped with $1 \times 10^{20}$ cm$^{-3}$ of P or As. The density of the impurity is set relatively low so as to minimize a reduction in the breakdown voltage of the gate oxide film 105, which may be caused by the diffusion of a dopant in a heating step performed later. Then, as is shown in FIGS. 5F and 6F, the polysilicon film 106 is worked with the use of photolithography and aeolotropic etching, thereby forming a floating gate and floating gate-isolating regions 107 (FIG. 6F). Subsequently, as is shown in FIGS. 5G and 6G, an insulating film 108 with a thickness of, for example, 25 nm, which consists of a silicon oxide film or a lamination film (ONO film) of a silicon oxide film and a silicon nitride film, is formed on the first polysilicon film 106 and the floating gate-isolating regions 107. Thereafter, as is shown in FIGS. 5H and 6H, a second polysilicon film 109 with a thickness of, for example, 400 nm is deposited on the first polysilicon film 108, and is then doped with $5 \times 10^{20}$ cm$^{-3}$ of P or As. Then, as is shown in FIGS. 5I and 6I, the resultant structure is worked by photolithography and aeolotropic etching, thereby simultaneously forming a select transistor portion 110 and a memory cell portion 111 (FIG. 5I).

As is shown in FIGS. 7A and 8A, that part of the second polysilicon film 109 is removed, which constitutes part of the gate electrode 112 of the select transistor. In other words, FIG. 8A shows a process for forming a contact portion of each of select gates arranged, for example, at every 128th or 256th bit lines, to facilitate signal transmission. FIG. 7A shows a process for forming a contact portion to be connected to a decoder. Then, as is shown in FIGS. 7B and 8B, an interlayer insulating film 113 such as BPSG (Boron Phospho-Silicate Glass) is deposited on the resultant structure. Reference numeral 116 denotes an oxide film formed before the deposition of the insulating film 113. As is shown in FIGS. 7C and 8C, contact holes 114 are formed, by means of photolithography and aeolotropic etching, in that portions of the insulating film 113 which are located on the first and second polysilicon films of the select transistor (and also on a memory cell, and drain and source regions, which are not shown). Subsequently, an aluminum wire 115 (i.e., a bit line BIT) is formed to connect the first polysilicon films 106 and 109 of the select transistor to each other.

To connect the first and second polysilicon films 106 and 109 of the select transistor is based on the following grounds:

Although the first polysilicon film 106 functions as the gate electrode of the select transistor, it has a high resistance. This is because a great amount of impurity cannot be introduced into the first polysilicon film which contacts the tunnel oxide film, to prevent the breakdown voltage of the tunnel oxide film from being reduced. Accordingly, the polysilicon film 106 cannot be effectively used as a wire, and instead the polysilicon film 109 formed thereon is used as a wire.

On the above-described grounds, contact holes must be formed in both the first and second polysilicon films 106 and 109, which means that a large number of contact holes must be formed. A large number of contact holes require contact fringes as mask tolerance. Accordingly, the larger the number of contact holes, the lower the integration of elements. Such select gates must be arranged, for example, at every 128th or 256th bit lines, which makes it difficult to increase the degree of integration of elements.

Moreover, as is shown in FIG. 5E, the second gate oxide film 105, which is thin enough to flow a tunnel current therethrough for writing or erasing data, is formed in the memory cell region 104. On the other hand, the select transistor requires the first gate oxide film 103, which has such a thickness as enables a normal transistor operation, in other words, such a thickness as can prevent a tunnel phenomenon (i.e. can prevent a tunnel current from flowing therethrough). To form oxide films of different thicknesses, mask tolerance is necessary in the process of photolithography, that is, tolerance is necessary for alignment between the boundary of the gate oxide film and the tunnel oxide film of the select transistor, and the gate electrode end of the memory cell or of the select transistor. The mask tolerance inevitably reduces the degree of integration of elements.

SUMMARY OF THE INVENTION

It is the object of the invention to provide a non-volatile semiconductor memory device, which is suitable for high integration, and has a select transistor with a small number of contact holes and no contact fringe since it is not necessary to form a contact hole in a first polysilicon film thereof, and a reliable tunnel oxide film formed in a simple process; and also to provide a method of manufacturing the semiconductor device.

To attain the object, there is provided a non-volatile semiconductor memory device comprising: memory cell means for storing data, which has a source/drain region formed in a surface portion of a semiconductor substrate, a first control gate electrode formed on the source/drain region, and a first charge-accumulating region formed between the first control gate electrode and the semiconductor substrate, the first charge-accumulating region being charged with electricity in a writing mode as a result of a difference in potential between the first control gate electrode and the source/drain region, thereby setting the threshold voltage of the memory cell means to a value higher than a voltage applied to the first control gate electrode in a reading mode, the first charge-accumulating region being discharged of electricity in an erasing mode as a result of a difference in potential reverse to that in the writing mode, thereby setting the threshold voltage of the memory cell means to a value lower than the voltage applied to the first control gate electrode in the reading mode; and select transistor means having a second control gate electrode located at an end portion of the memory cell means, and a second charge-accumulating region similar to the first charge-accumulating region and located between the second control gate electrode and the semiconductor substrate, the select transistor means having a positive threshold voltage at least in the reading mode and the writing mode for the memory cell means.

Moreover, there is provided a method of manufacturing the non-volatile semiconductor memory device, characterized in that it includes the step of radiating ultraviolet rays into the channel region of the select transistor means so that the select transistor means can have a positive neutral threshold voltage.

Since as described above, the select transistor has the same gate electrode structure as the memory cell, the control gate electrode of a low resistance can be used as the control wire of the select gate, and hence a contact hole which interrupts high integration can be omitted. In addition, it is not necessary to form gate insulating films of different thicknesses for the memory cell and the select transistor, which can omit the process which may contaminate the gate insulating films.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A–5J are cross sectional views, taken along line 5—5 of FIG. 4 and useful in sequentially explaining the processes of manufacturing the conventional EEPROM;

FIGS. 6A–6J are cross sectional views, taken along line 6—6 of FIG. 4 and useful in sequentially explaining the processes of manufacturing the conventional EEPROM;

FIGS. 10K and 10L are cross sectional views, taken along line 10—10 of FIG. 9 and useful in sequentially explaining processes for manufacturing a memory cell employed in a NAND type EEPROM according to a third embodiment of the invention;

FIGS. 11K and 11L are cross sectional views, taken along line 11—11 of FIG. 9 and useful in sequentially explaining processes for manufacturing the memory cell employed in the NAND type EEPROM according to the third embodiment of the invention;

FIG. 12B is a cross sectional view, taken along line 12—12 of FIG. 9 and showing the memory cell employed in the NAND type EEPROM according to the third embodiment of the invention;

FIG. 21 is a table, showing examples of voltages applied to respective elements during erasing, writing and reading data in and from a memory cell according to the invention;

FIG. 22 is a plan view, showing part of a memory cell array employed in a NAND type EEPROM according to a second embodiment of the invention;

FIGS. 23–26 are cross sectional views, taken along lines 23—23, 24—24, 25—25 and 26—26 in FIG. 22;

FIG. 27 is a circuit diagram, showing in detail a row sub-decoder portion employed in the third embodiment of the invention;

FIG. 28 is a table, showing examples of voltages applied to respective elements for determining the operation of the circuit of FIG. 27;

FIG. 32 is a circuit diagram, showing an applied example of the invention.

DETAILED DESCRIPTION OF THE PREFERRED EMBODIMENTS

Figure 9:
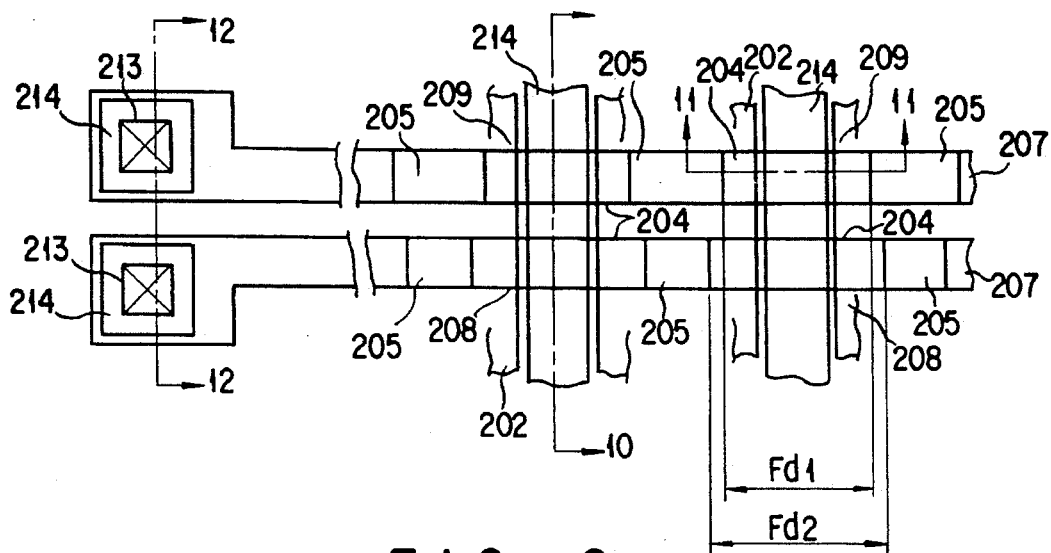
FIG. 9 is a plan view, showing part of a memory cell array employed in a NAND type EEPROM according to a first embodiment of the invention.

FIG. 9 is a plan view, showing part of a memory cell array employed in a NAND type EEPROM according to a first embodiment of the invention. FIGS. 10A–10J, 11A–11J and 12 are cross sectional views, taken along lines 10—10, 11—11 and 12—12 of FIG. 9, and useful in sequentially explaining the processes of manufacturing the EEPROM of the first embodiment.

Figure 10A:
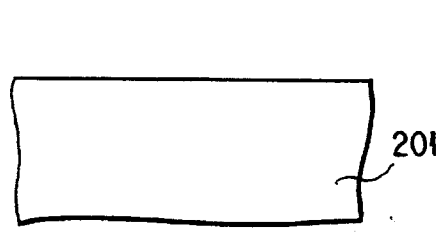
FIGS. 10A–10J are cross sectional views, taken along line 10—10 of FIG. 9 and useful in sequentially explaining the processes of manufacturing the EEPROM.
Figure 11A:
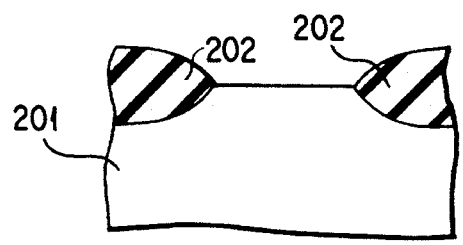
FIGS. 11A–11J are cross sectional views, taken along line 11—11 of FIG. 9 and useful in sequentially explaining the processes of manufacturing the EEPROM.
Figure 10B:
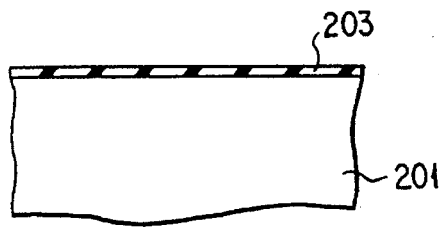
Figure 11B:
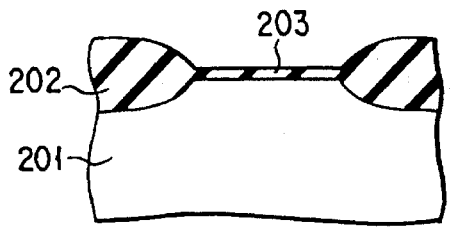
Figure 10C:
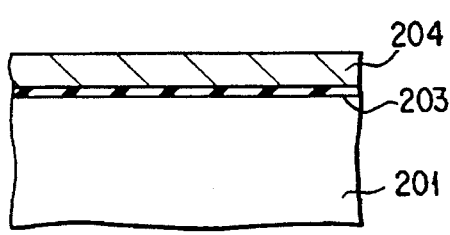
Figure 11C:
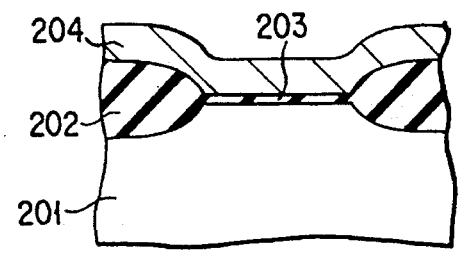
Figure 10D:
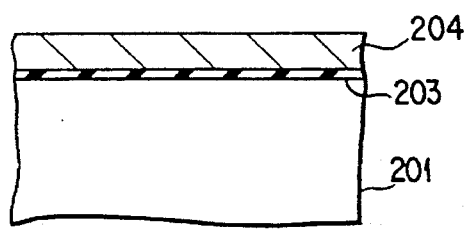
Figure 11D:
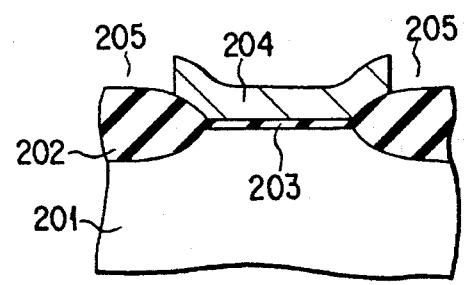
Figure 10E:
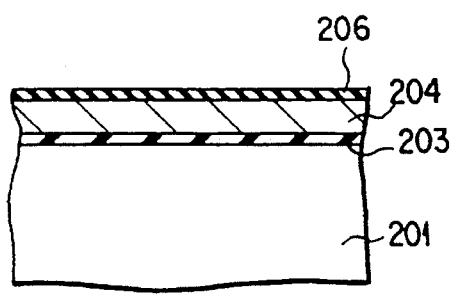
Figure 11E:
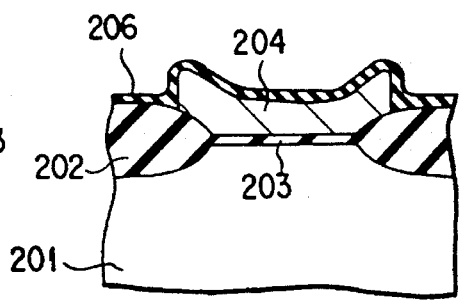
Figure 10F:
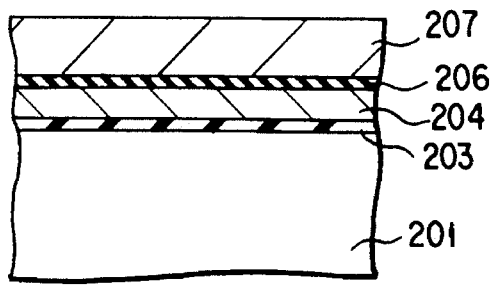
Figure 11F:
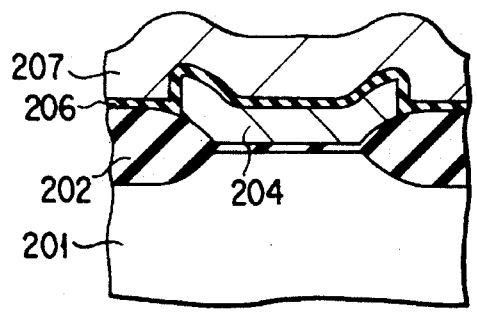
Figure 10G:
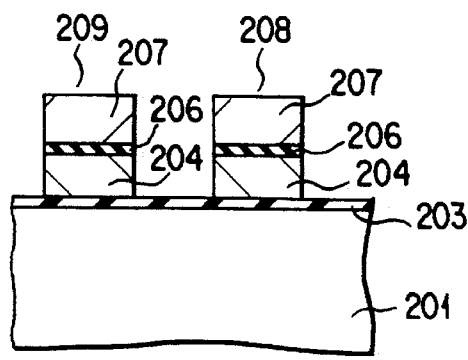
Figure 11G:
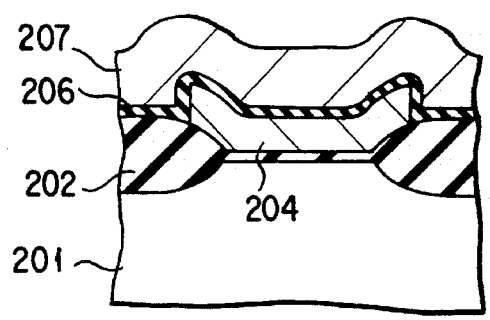
Figure 10H:
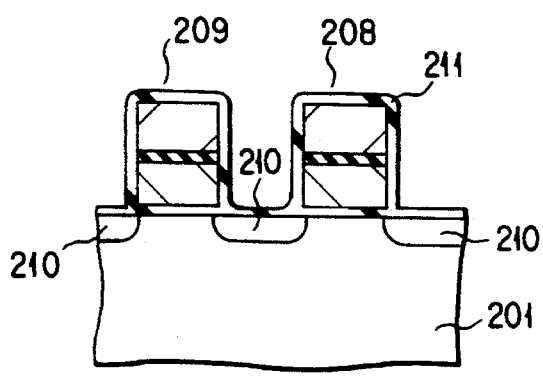
Figure 11H:
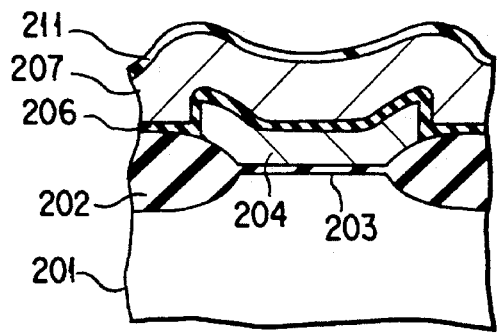
Figure 10I:
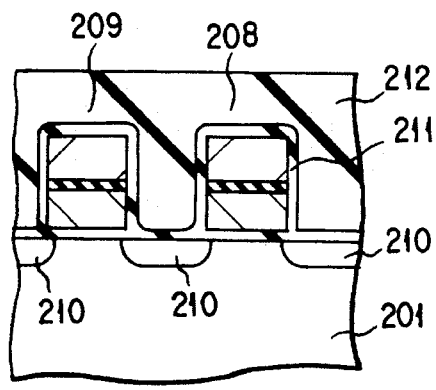
Figure 11I:
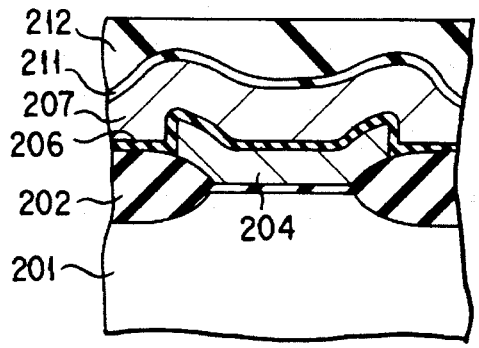
Figure 10J:
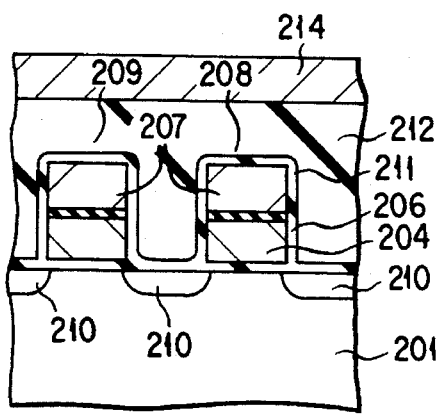
Figure 11J:
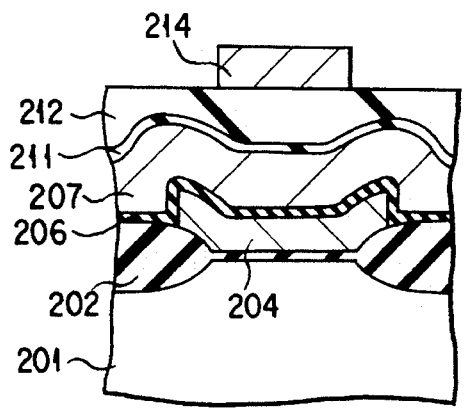
Figure 12A:
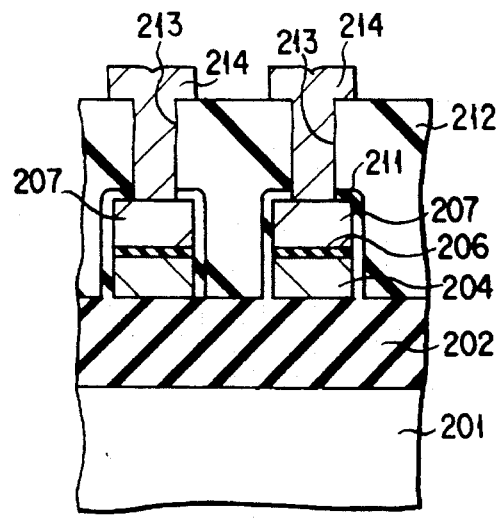
FIG. 12A is a cross sectional view, taken along line 12—12 of FIG. 9.
Figure 33:
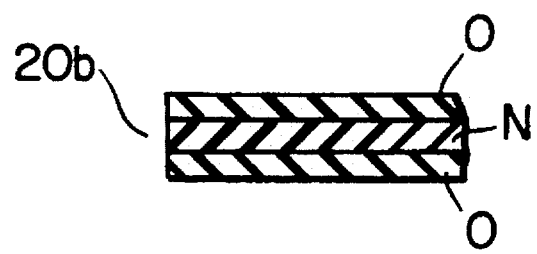
FIG. 33 shows the films of film 206 of FIG. 10E.

As is shown in FIGS. 10A and 11A, element-isolating insulation films 202 are selectively formed on a semiconductor substrate 201. The element-isolating insulation films 202 shown in FIG. 11A are oxide films with a thickness, for example, of 800 nm. Subsequently, as is shown in FIGS. 10B and 11B, a gate oxide film 203 with a thickness of 10 nm is formed on an element region, for example, by dry oxidation at 800° C. Then, as is shown in FIG. 10C and 11C, a polysilicon film 204 with a thickness, for example, of 200 nm is deposited on the gate oxide film 203 and the element-isolating regions 202 by low pressure CVD (LPCVD). Thereafter, as is shown in FIGS. 10D and 11D, the polysilicon film 204 is doped with $5 \times 10^{19} - 2 \times 10^{20}$ cm$^{-3}$ of P or As by ion injection or vapor diffusion. The impurity density is relatively low, but provides a high resistance which can prevent a reduction in the breakdown voltage of the gate oxide film 203 due to diffusion of dopant in a heating process performed later. Then, part of the polysilicon film 204 on the element-isolating regions 202 is removed by aeolotropic etching to thereby form floating gate-isolating regions 205 (FIG. 11D). Subsequently, as is shown in FIGS. 10E, 11E, and 33 an oxide film with a thickness, for example, of 15 nm is formed on the polysilicon film 204 and the floating gate-isolating regions 205 by dry oxidation at a temperature of 900°–1000° C.; then a silicon nitride film with a thickness, for example, of 15 nm is deposited on the resultant structure by the LPCVD method; and an oxide film with a thickness, for example, of 5 nm is formed by wet oxidation at a temperature of 900°–1000° C., thus forming a lamination type insulating film (ONO film) 206 consisting of a SiO$_2$ film, a SiN film and a SiO$_2$ film. Then, as is shown in FIGS. 10F and 11F, a polysilicon film 207 with a thickness, for example, of 400 nm is deposited on the ONO film 206 by the LPCVD method. The polysilicon film 207 is doped with $3 \times 10^{20} - 5 \times 10^{20}$ cm$^{-3}$ of P or As by ion injection or vapor diffusion. Thereafter, as is shown in FIGS. 10G and 11G, the polysilicon 207, the ONO film 206 and the polysilicon film 204 are etched in this order by lithography and aeolotropic etching, thereby simultaneously forming gate portions of a memory cell 208 and a select transistor 209 (FIG. 10G). As is shown in FIGS. 10H and 11H, P or As is injected to form a diffusion layer 210 which will be used as a source/drain region. Then, an oxide film 211 is formed on the polysilicon films 204 and 207 and the diffusion layer 210 by dry oxidation at a temperature of 800°–1000° C. Thereafter, as is shown in FIGS. 10I and 11I, a BPSG film 212 with a thickness, for example, of 1000 nm is deposited on the oxide film 211, and as is shown in FIGS. 10J, 11J and 12A, contact holes 213 are formed by lithography and aeolotropic etching to expose a portion of the diffusion layer 210 (a bit line contact portion, not shown), and those portions of the polysilicon film 207 which are included in the memory cell 208 and the select transistor 209. Subsequently, an aluminum film with a thickness, for example, of 800 nm is deposited by sputtering or the CVD method, and then the aluminum film is selectively etched by lithography and aeolotropic etching to form a wire 214 (i.e., a bit line).

Figures 1, 2:
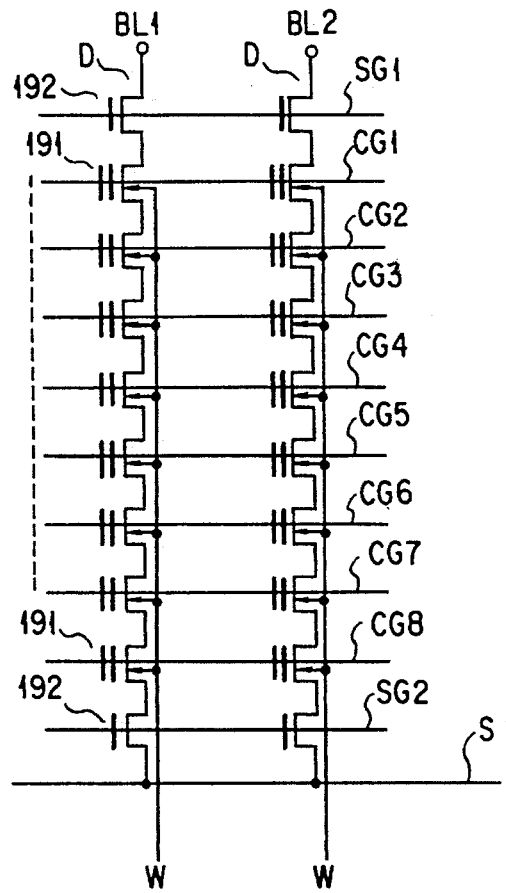
FIG. 1 is a circuit diagram, showing part of a memory cell array employed in a conventional NAND type EEPROM.
FIG. 2 is a table, showing examples of voltages applied to respective elements in the memory cell array of FIG. 1 during erasing, writing and reading data.
Figure 3:
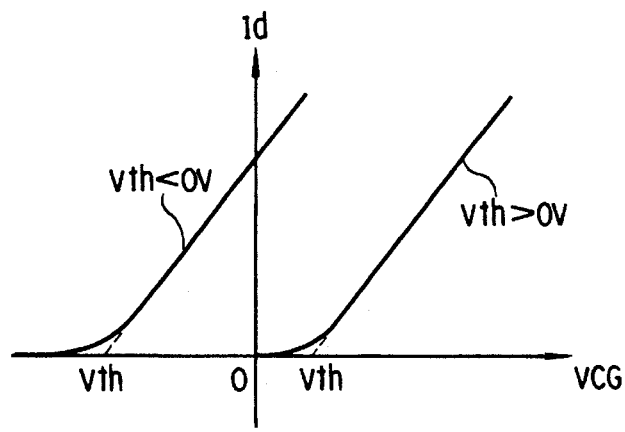
FIG. 3 is a graph, showing the electrostatic characteristics of a cell having a threshold voltage Vth higher than 0 V and those of a cell having a threshold voltage lower than 0 V.
Figure 4:
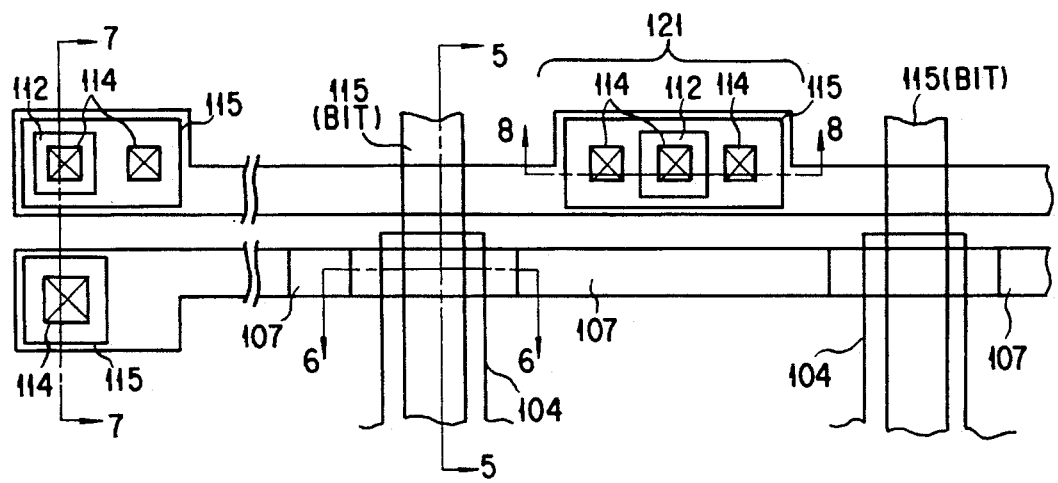
FIG. 4 is a plan view, showing part of a memory cell array employed in the conventional NAND type EEPROM.
Figure 5A:
Figure 6A:
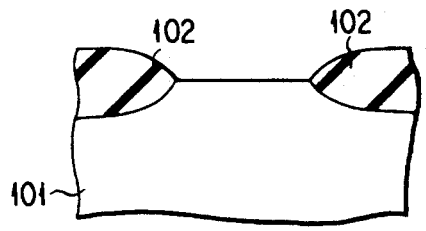
Figure 5F:
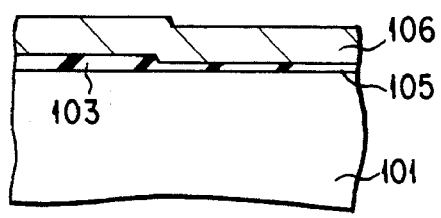
Figure 6F:
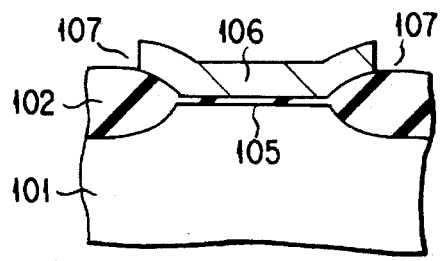
Figure 5G:
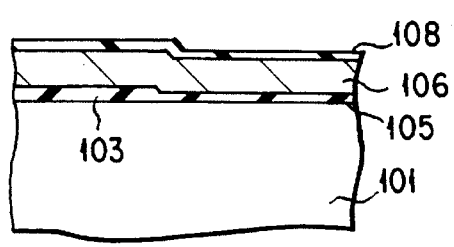
Figure 6G:
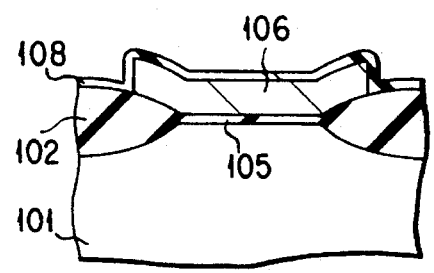
Figure 5H:
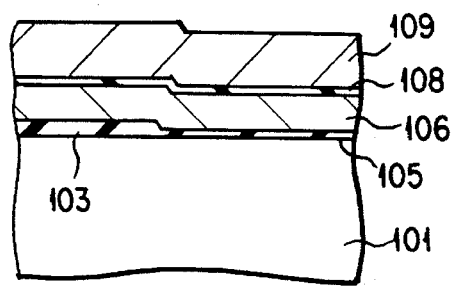
Figure 6H:
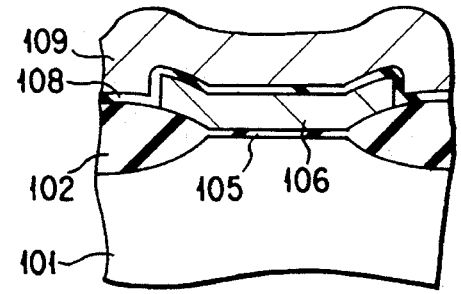
Figure 5I:
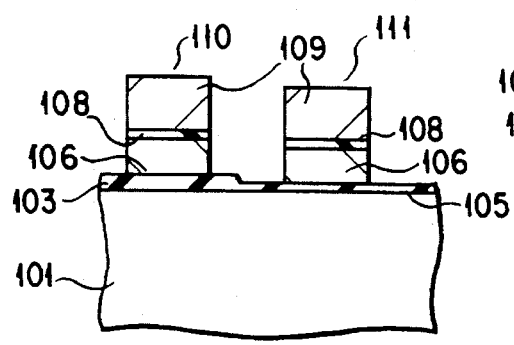
Figure 6I:
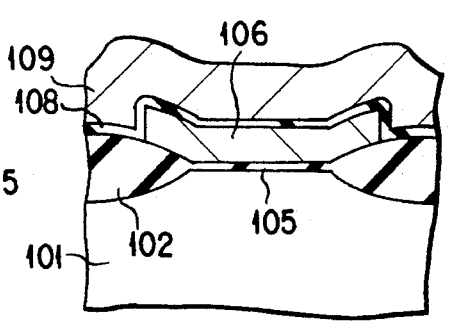
Figure 5J:
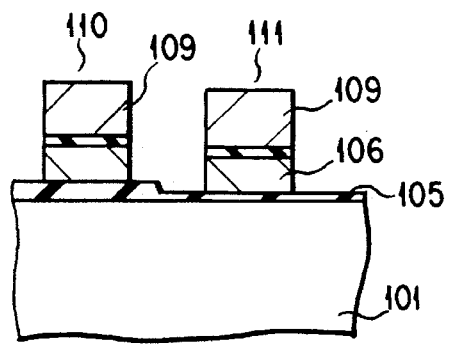
Figure 6J:
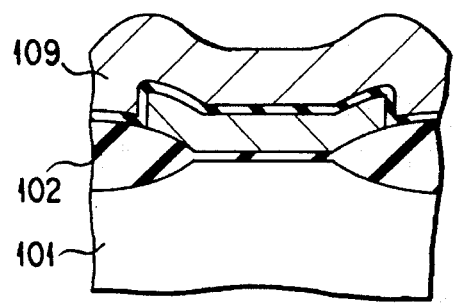
Figure 7A:
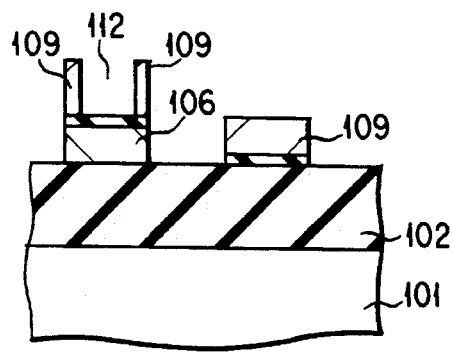
FIGS. 7A–7C are cross sectional views, taken along line 7—7 of FIG. 4 and useful in sequentially explaining the processes of manufacturing the conventional EEPROM.
Figure 8A:
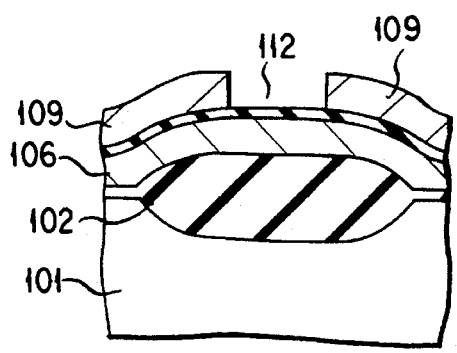
FIGS. 8A–8C are cross sectional views, taken along line 8—8 of FIG. 4 and useful in sequentially explaining the processes of manufacturing the conventional EEPROM.
Figure 7B:
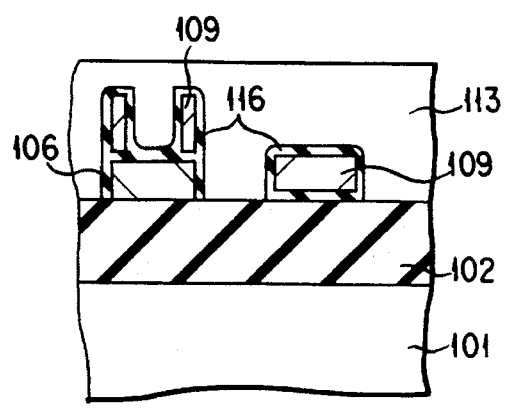
Figure 8B:
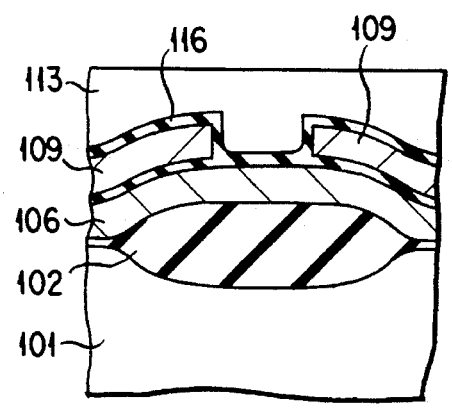
Figure 7C:
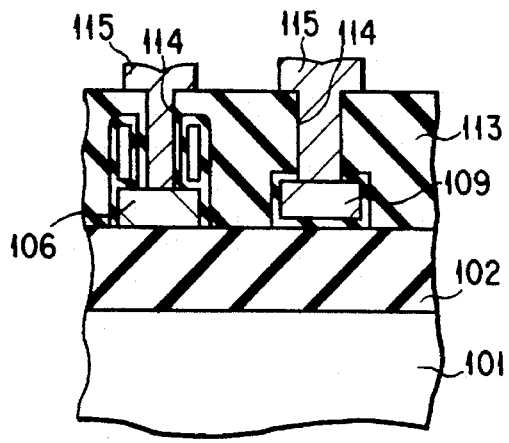
Figure 8C:
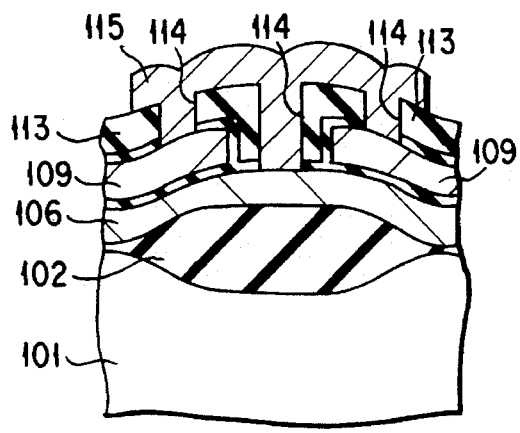

FIG. 12A is a cross sectional view, showing a contact region to be connected to the side of a decoder (not shown). Electrodes made of polysilicon films 204 and 207 are formed on the element-isolating region 202. The wire of the select transistor 209 contacts the polysilicon film 207 (gate wire) having a resistance as low as the memory cell. Since in this structure, no contact holes are formed in the first polysilicon film 204 of a high resistance, it is not necessary to form a contact hole in the gate wire of the select transistor between a cell array. In other words, the region 121 in FIG. 4 is not necessary, which enables the number of contact holes to be minimized and hence contributes to high integration of elements.

Moreover, it is not necessary to provide the memory cell and the select transistor with gate insulating films of different thicknesses. Accordingly, the gate insulating films of the memory cell and the select transistor can be formed in the same process, which does not need mask tolerance for alignment as required in the conventional lithography process. As a result, the process which may contaminate the gate insulating films can be omitted, enhancing the reliability of the memory cell and contributing to an increase in the degree of integration.

Figure 13:
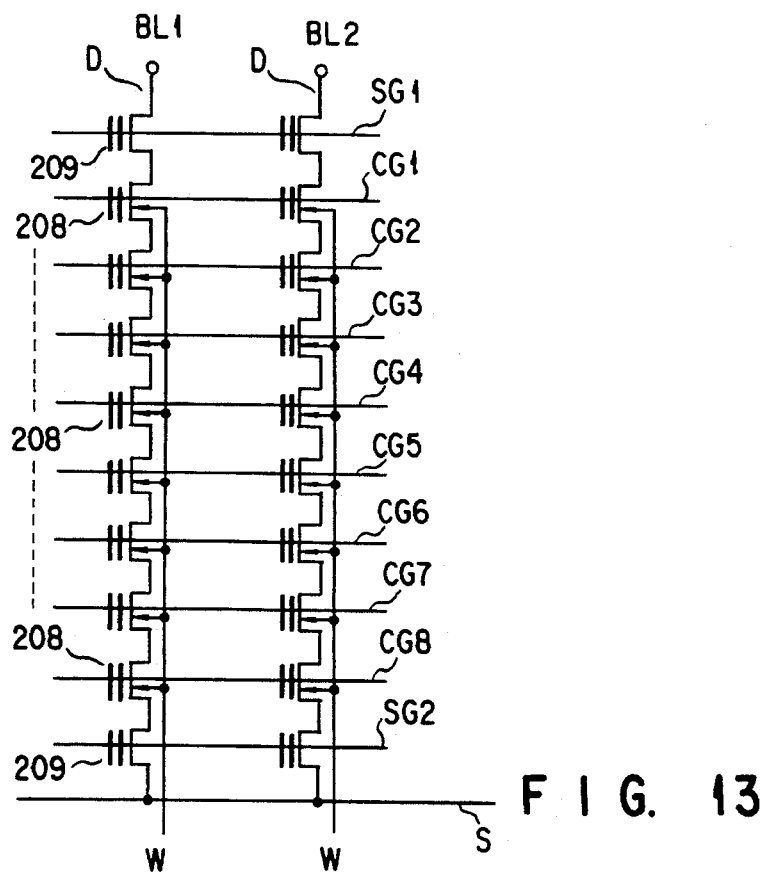
FIG. 13 is a circuit diagram, showing some memory cells in the memory cell array portion of FIG. 9.

FIG. 13 is a circuit diagram, showing some memory cells employed in the cell array portion of the NAND type EEPROM shown in FIG. 9. Elements similar to those in the above-described processes are denoted by corresponding reference numerals. As is shown in FIG. 13, there are provided a plurality of lamination type memory cells 208 (hereinafter referred to also as "cells") connected in series and controlled by control gates CG1–CG8. Select transistors 209 are connected to opposite ends (i.e., the drain side D and the source side S) of the series circuit of the memory cells, and are controlled by select gates SG1 and SG2. The select transistor 209 has a floating gate similar to that of the memory cell 208. In other words, the floating gate is formed of the first polysilicon film 204 shown in FIGS. 10J, 11J and 12A, while the select gates SG1 and SG2 and the control gate CG are formed of the second polysilicon film 207 shown in the same figures.

Figure 14:
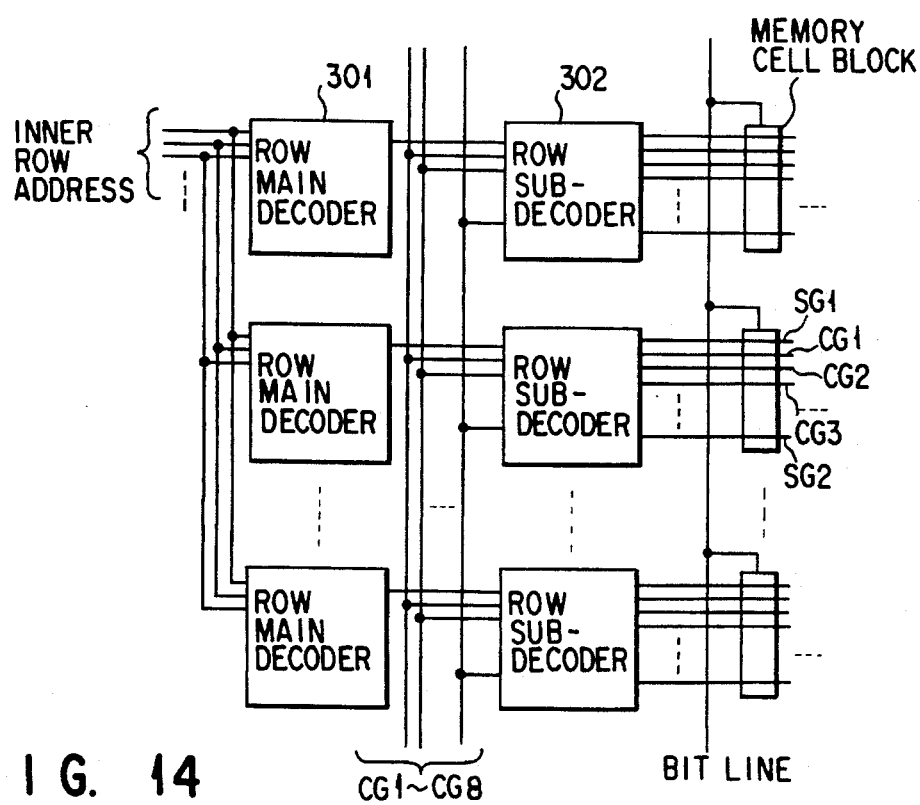
FIG. 14 is a circuit diagram, showing an essential part of a decoder system for performing the threshold voltage of a select transistor according to the invention.

The select transistors 209 other than one selected at the time of writing or reading must be set nonconductive. To this end, it is necessary to prepare SG writing means for beforehand charging the floating gates of the select transistors so that they have a positive threshold voltage. FIG. 14 shows an example of a circuit of a decoder system, according to the invention, for controlling the threshold voltage of each select transistor 209. In this circuit, row main decoders 301 and row sub-decoders 302 for decoding the select gates SG are incorporated in the decoder for the control gates CG. The row main decoder 301 has a structure as shown in FIG. 15, and the row sub-decoder 302 has a structure as shown in FIG. 16.

Figure 15:
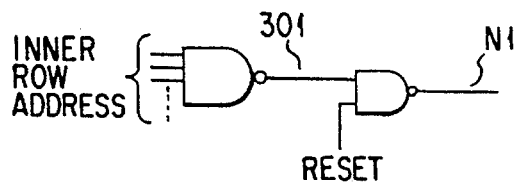
FIG. 15 is a circuit diagram, showing in detail a row main decoder appearing in FIG. 14.

As is shown in FIG. 15, the row main decoder 301 consists a group of NAND circuits for selecting one of memory cell blocks. An address input from a peripheral circuit is converted to an inner row address by means of an address latch circuit (not shown), and one of the memory cell blocks is selected with the use of the inner row address. Thus, a signal is supplied from a node N1 to the row sub-decoder shown in FIG. 16. The input node N1 of a selected row sub-decoder 302 has a potential of 5 V (Vcc), and that of a non-selected one has a potential of 0 V.

Figure 16:
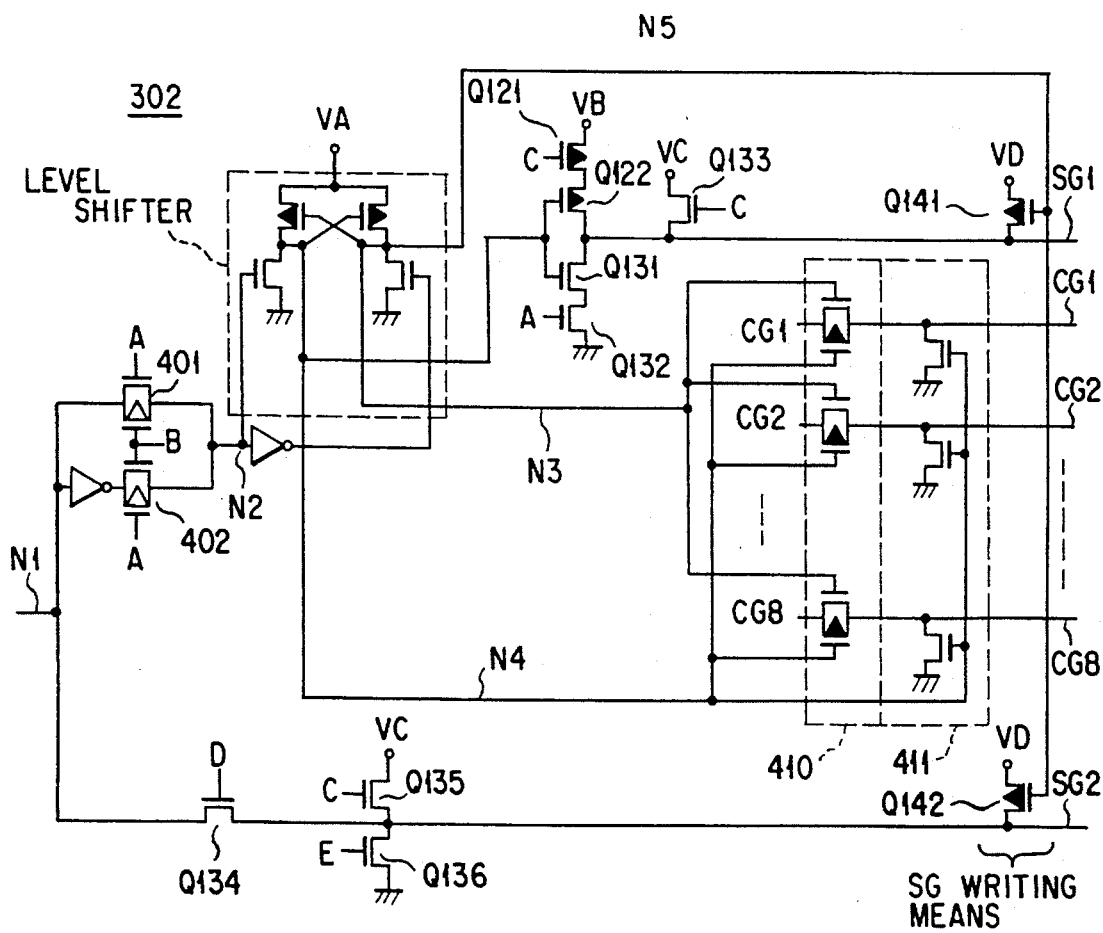
FIG. 16 is a circuit diagram, showing in detail a row sub-decoder portion appearing in FIG. 14.
Figures 17, 18:
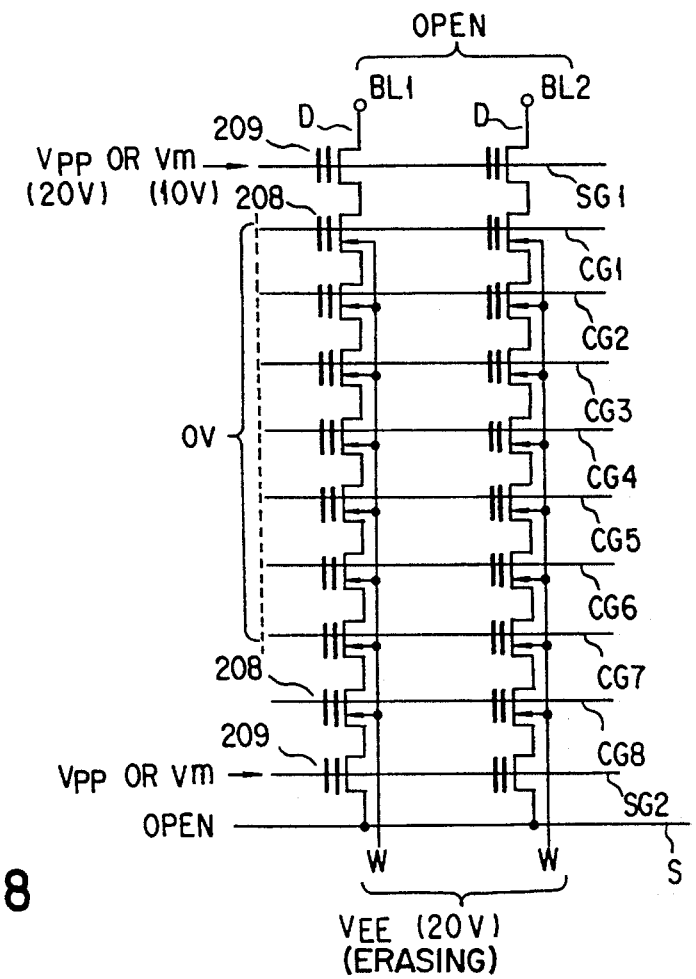
FIG. 17 is a table, showing examples of voltages applied to respective elements for determining the operation of the circuit of FIG. 16.
FIG. 18 is a circuit diagram, useful in explaining an operation performed at the time of data erasing in a memory according to the invention.

In the row sub-decoder 302 shown in FIG. 16, different potentials are applied to input signals A, B, C, D and E, and power sources VA, VB and VC in a writing mode, a reading mode, a select-gate writing mode and an erasing mode, respectively, as indicated by a table shown in FIG. 17. In the table, a voltage Vcc indicates a normal power source, for example, of 5 V, a voltage Vpp a high voltage (e.g. 20 V) for writing and erasing, a voltage Vm a half of Vpp (e.g. 10 V), and a voltage GND 0 V.

Writing at the select gate SG will be explained with reference to FIGS. 16 and 17. When the select-transistor writing mode (i.e., the SG writing) has been set, the potential of the input node N1 of the row sub-decoder 302 becomes 5 V (Vcc), causing the signals A and B to have potentials of 0 V and 5 V, respectively. As a result, a switch 401 consisting of a P-channel MOS transistor and an N-channel MOS transistor is set nonconductive, and a switch 402 is set conductive. Accordingly, the potential of the node N2 becomes 0 V, which is opposed to the potential of the node N1. Since the power source VA is set at Vpp (20 V), the potentials of the nodes N3 and N4 of the row sub-decoder section become 0 V and 20 V, respectively. Thus, the output gate 410 of the row sub-decoder becomes nonconductive, and a discharging N-channel transistor array 411 conductive, thereby setting all the control gates CG to 0 V.

At an end of the drain-side select line (SG1), the same potential (20 V) as that of the node N4 is applied to the gates of transistors Q122 and Q131, while 0 V is applied to the gates of P-channel MOS transistors Q121 and Q132 connected to the transistors Q122 and Q131, respectively. As a result, the end of the drain-side select line becomes nonconductive. Further, transistors Q134, Q135 and Q136 at an end of the source-side select line (SG2) are nonconductive. Therefore, 0 V which is the same potential as that of the node N3 is applied to a node N5, causing SG-writing transistors Q141 and Q142 to be conductive. As a result, a high voltage Vpp of 20 V is applied to the select gates SG1 and SG2 from the power source VD.

The above-described decoder sets the threshold voltage of each the select transistors 209 shown in FIG. 13, in a manner described below. First, the potentials of all the control gates CG and the select gates SG are set to 0 V, the bit lines and the sources are opened, and the potential of the substrate is set to Vpp, to flow a tunnel current from the floating gates CG and SG to the substrate thereby to draw all electrons from all the floating gates. Then, to set the threshold voltage of the select transistors 209 to a value more than 0 V, a high voltage Vpp, for example, of 20 V is applied to the select gates SG and 0 V is applied to the other gate electrodes. As a result, electrons are injected into the floating gates of the select transistors SG, setting the threshold voltages thereof to a value more than 0 V. The threshold voltages must not be set to a too high value so as to transmit a bit line potential (of an intermediate potential Vm, for example, of 10 V) in the writing mode, but be set, for example, to about 1 V.

The operations performed at the time of erasing, writing and reading data in a memory cell will now be explained. Referring first to FIG. 18, all the control gates CG are set to 0 V, the bit lines BL and the source are opened, and the substrate W is set to VEE (e.g. 20 V), thereby to draw all electrons from all the floating gates with the use of tunnel phenomenon at the oxide film. Thus, the threshold voltages of all cells are set to a value equal to or less than 0 V. In other words, all cells are set in a normally-on state (=a depletion state; a data "1" state). At this time, Vpp (e.g. 20 V) or Vm (e.g. 10 V) is applied to the select gates SG so as to prevent electricity in the floating gates of the select transistors from being drawn. The threshold voltage of an erased cell is set to a value less than 0 V (a negative threshold voltage).

Figure 19:
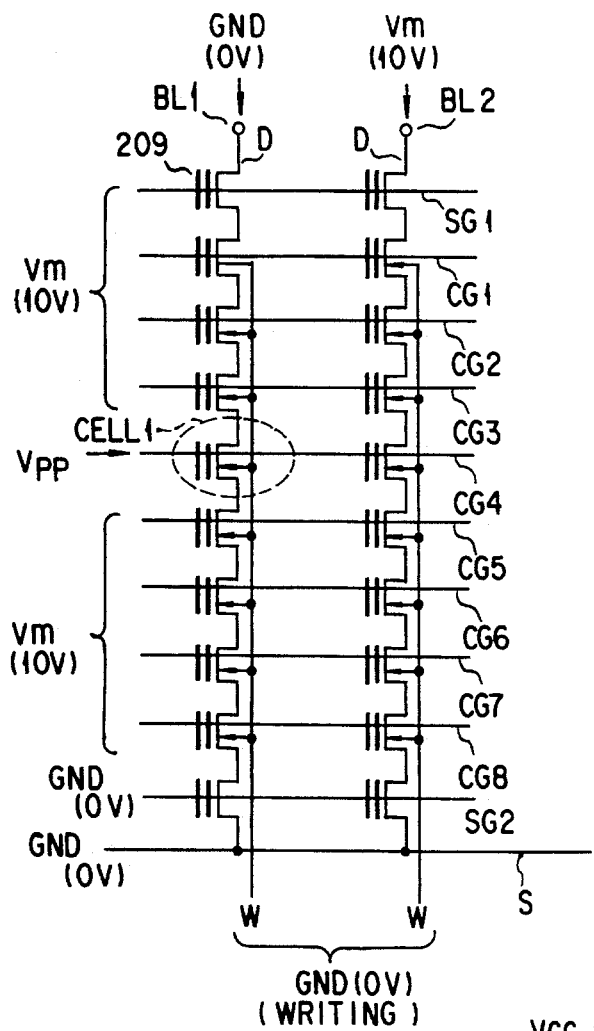
FIG. 19 is a circuit diagram, useful in explaining an operation performed at the time of writing data in a memory according to the invention.

At the time of writing, a writing voltage Vpp, for example, of 20 V is applied to the control gate CG of a selected cell, and an intermediate voltage Vm (between Vpp and 0 V), for example, of 10 V is applied to the control gate of non-selected cells, as in the conventional case. In this state, 0 V is applied to the one of the bit lines BL which is connected to a cell in which data "0" is to be written, while Vm is applied to the one of the bit lines which is connected to a cell in which data "1" is kept. In other words, as is shown in FIG. 19, to selectively write data into a memory cell CELL1 connected to the control gate CG4, Vpp (20 V) is applied to the control gate CG4, Vm (10 V) is applied to the other control gates CG, the select gate SG1 and the bit line BL2, and a ground voltage (GND) is applied to the bit line BL1 and the select gate SG2. As a result, an electric field sufficient to flow a tunnel current is applied to the cell CELL1, thereby making the threshold voltage of the selected cell positive and writing data therein (writing data "0"). Since Vm is applied to the channel side of each of the other cells, the electric field applied to the tunnel oxide film of each of the other cells is reduced (to 5 MV/cm), and hence no tunnel current occurs. The threshold voltage of the cell in which data is to be written is kept at a value more than 0 V and less than Vcc (e.g. 5 V).

Figure 20:
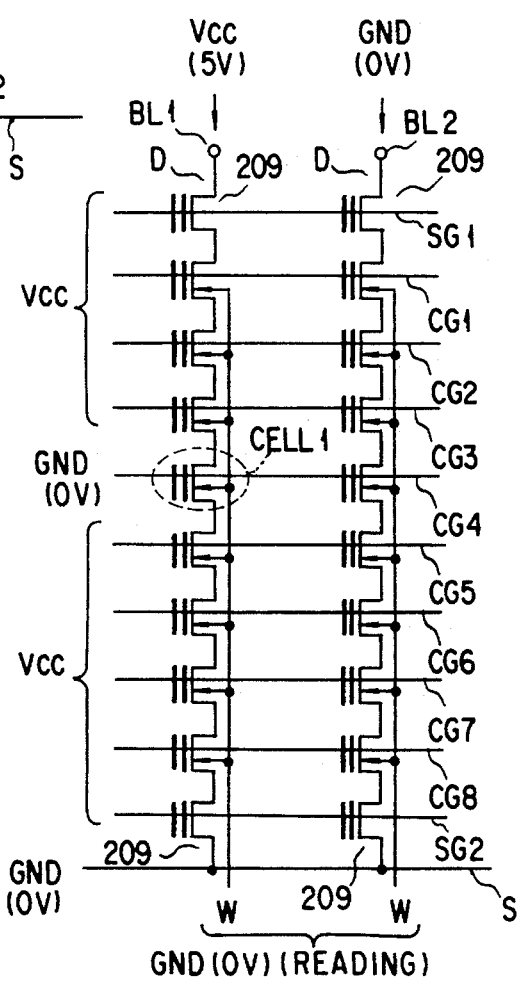
FIG. 20 is a circuit diagram, useful in explaining an operation performed at the time of reading data from a memory according to the invention.

At the time of reading, the bit line connected to a selected cell is precharged with Vcc (e.g. 5 V), and the bit line connected to a non-selected cell is set to 0 V, as in the conventional case. Further, 0 V is applied to the control gate of the selected cell, and Vcc is applied to the control gate of the non-selected cell, thereby opening the control gate to determine whether the data stored therein is "0" or "1" in accordance with whether or not a current flows into the cell through the bit line. If the selected cell is depleted, the current flows therein, whereas if the threshold voltage thereof is positive, no current flows therein. FIG. 20 is a view, showing voltages to be applied to read data from the cell CELL1. FIG. 21 is a table, illustrating examples of voltages applied to various elements at the time of erasing, writing and reading data from and into a memory cell in the above-described embodiment.

In the above-described embodiment, the floating gates of the select transistors can be automatically charged with electricity on the side of the user, for example, in the following method:

(1) To erase data from all the select transistors and the memory cells at a time;

(2) To write data into the select transistors (verification may be performed for threshold voltage control); and (3) To selectively write data into a memory cell.

The above operations (1)–(3) are performed at the time of rewriting data.

The above method, however, has (1) the disadvantage that the select transistors may well degrade due to writing/erasing stresses applied thereto, and (2) the disadvantage that writing data into the select transistors at the time of data rewriting inevitably requires a long writing time period. To avoid this, the floating gates of the select transistors are charged with electricity by the manufactures before the products are marketed. Where the data is rewritten by the user, Vpp or Vm is applied to the select transistors at the time of data erasing, so as to prevent the charges of the select transistors from being erased.

Moreover, at the time of writing data into the select transistors, it is necessary to control the threshold voltage of each select transistor, for example, to about 1 V. Where the select transistor has the same coupling ratio (Cs2/(Cs1+Cs2)) as the memory cell, if the same voltage as the writing voltage Vpp applied to the memory cell is applied to the select transistor, writing data into the select transistor must be performed in a time shorter than that required to write data into the memory cell, which makes it difficult to control the threshold voltage of the select transistor. In addition, if the voltage Vpp applied to the select transistor at the time of writing data therein is reduced, the circuit is inevitably complicated. These problems can be easily solved by lowering the coupling ratio (Cs2/(Cs1+Cs2)) of the select transistor than that of the memory cell. For example, making shorter the length Fd1 (see FIG. 9) of the floating gate of the select transistor in the direction of a word line than the length Fd2 of the floating gate of the memory cell can reduce the electrostatic capacitance Cs2 between the floating gate of the select transistor and the control gate, and hence can reduce the coupling ratio thereof. Reducing the coupling ratio of the select transistor can prevent erroneous erasing or writing therein at the time of erasing or selective writing.

FIG. 22 is a plan view, showing part of a memory cell array employed in a NAND type EEPROM according to a second embodiment of the invention. FIGS. 23, 24, 25 and 26 are cross sectional views, taken along lines 23—23, 24—24, 25—25 and 26—26 in FIG. 22. The second embodiment is another example in which the coupling ratio of the select transistor is lower than that of the memory cell, and differs from the FIG. 9 embodiment in that no floating gate-isolating regions 205 are formed, i.e., a continuous floating gate (polysilicon film 204) is formed as shown in FIG. 24. Thus, in this embodiment, the polysilicon film 204 which would be shown in cross sectional views (if prepared for explaining the manufacturing process) corresponding to FIGS. 11D–11J has no floating gate-isolating regions 205 as shown in FIG. 11C. Further, in this embodiment, in order to make the coupling ratio of the select transistor lower than that of the memory cell, it is necessary to cause the relationship between the width L of the floating gate-isolating region 205 and the thickness T of the polysilicon film 204 (FIG. 26) to satisfy the formula 2T>L.

Since in the above-described structure, the select transistor has no floating gate-isolating regions 205, the polysilicon film serves as a common floating gate for the overall select transistors. Accordingly, the select transistors can have the same coupling ratio, and hence can have the same threshold voltage. The other structural elements of this embodiment are similar to those employed in FIG. 9, and the number of required contact holes is minimized, which contributes to high integration of elements.

A third embodiment of the invention will now be explained. In the first and second embodiments, other than that of the select transistors 209 which is selected during writing or reading must be kept nonconductive. In other words, the select transistors must be enhancement type transistors. Moreover, since as described above, Vpp is applied to that control gate of a memory cell which is connected to the control gate of a selected memory cell into which data is to be written, it is necessary to apply Vm (e.g. 10 V) to the channel of the memory cell (to write data "1" in FIG. 21) so as to prevent erroneous writing. A structure according to the third embodiment will be explained, which enables the select transistor to have a desired threshold voltage under the above conditions without charging the floating gate thereof (i.e. without writing data into the select transistor). The third embodiment is characterized by select transistors, which are constructed to have positive neutral threshold voltages while they are radiated with ultraviolet rays and data pieces in all memory cells are erased by the radiation of ultraviolet rays. The voltage between the source and the drain of the transistor is determined from the gate voltage and the threshold voltage thereof. Since an electric field to be applied to the tunnel oxide film so as to allow a tunnel current (F-N current) to flow therethrough has an intensity of about 6 MV/cm, the following formula (1) is established:

$$(Vpp-(VSG1-VthSG)) \times CRcell/Ttunnel < 6 MV/cm \quad (1)$$

where VthSG represents the neutral threshold voltage of the select transistor after the radiation of ultraviolet rays, CRcell the coupling ratio of a memory cell, and Ttunnel the thickness of the tunnel oxide film of the cell. Further, the coupling ratio CRcell of the memory cell is given by $$CRcell=(Sinter\text{-}poly/Tinter\text{-}poly)/((Sinter\text{-}poly/Tinter\text{-}poly)+(Stunnel/Ttunnel)) \quad (2)$$

where Tinter-poly represents the thickness of an insulating film formed between the control gate and the floating gate of the memory cell, Sinter-poly the area of the insulating film, and Stunnel an area formed between the tunnel oxide film and the floating gate electrode of the memory cell.

When VSG1 (=10 V in FIG. 21) has been applied to the control gate of the select transistor during writing, data must not be written into the floating gate of the transistor. If this has been done, VthSG in the formula (1) is increased, and accordingly erroneous writing is performed in a cell into which data "1" is to be written. In addition, since the select transistor must be of an enhancement type, it must not assume an erased state at the time of erasing. To this end, the following formulas (3) and (4) must be established:

$$VSG1 \times CRSG1/Ttunnel < 6 \ MV/cm \quad (3)$$

$$(Vwell-VSG1) \times CRSG1/Ttunnel < 6 \ MV/cm \quad (4)$$

where CRSG1 represents the coupling ratio of the select transistor.

Moreover, if the neutral threshold voltage VthSG of the select transistor after the radiation of ultraviolet rays is high, erroneous writing occurs in the same manner as above. To avoid this, it is necessary to adjust threshold voltage of the select transistor by injecting ions into the channel thereof. For example, where the CRcell and the CRSG1 are set to 0.5, the examples of voltages shown in FIG. 21 satisfy the formulas (1)–(4). At this time, the neutral threshold voltage VthSG of the select transistor after the radiation of ultraviolet rays is about 1 V. However, the neutral threshold voltage VthSG is not limited to 1 V since it is determined on the basis of the relationship between the potentials of all elements.

FIGS. 10K, 10L, 11K, 11L and 12B are cross sectional views, showing a case where the method for injecting ions into the select transistor, according to the third embodiment, is applied to the first embodiment. Between the processes of FIG. 10A and FIG. 10B and between the processes FIG. 11A and FIG. 11B, a process is inserted, wherein impurity ions are injected into the channel region of the select transistor with a resist film coated on the portion of the transistor other than the channel-forming region, as is shown in FIGS. 10K and 11K. The process according to the third embodiment can be applied to the second embodiment, too, in the same manner as above. The process of the third embodiment will be explained in more detail. As is shown in FIGS. 10K and 11K, an oxide film 311 with a thickness of, for example, 20 nm is formed on the element region of a substrate 201 after the processes of FIGS. 10A and 10B. A resist film 312 is coated on the portion of the 10 select transistor other than the channel-forming region by photolithography. Thereafter, about $1\times10^{13}$ cm$^{-2}$ of an impurity 313, such as boron, is injected into the channel-forming region of the select transistor by ion injection at an acceleration voltage of 30 keV. Subsequently, the oxide film 311 of 20 nm is removed by wet etching. After the ion injection process, the impurity 313 (boron) is contained in the channel region of the select transistor shown in FIGS. 10B, 11B et seq. FIGS. 10L, 11L and 12B correspond to FIGS. 10J, 11J and 12A. The channel region of the select transistor 209 shown in FIGS. 10L and 11L contains the impurity (boron) 313. Only in this point, the third embodiment differs from the first embodiment (FIGS. 10J, 11J and 12A). Therefore, the third embodiment has the same plan view as FIG. 9. The impurity is not limited to boron, but may be BF$_2$. Further, the dose is not limited to $1\times10^{13}$ cm$^{-2}$, but may be varied to such a value as enables a desired threshold voltage to be created. Similarly, the acceleration voltage is not limited to 30 keV, but may be varied to such a value as enables desired characteristics to be provided. Also, if it is necessary to restrain an increase in voltage due to the well-known narrow channel effect of a transistor, P or As may be injected instead of boron. Moreover, the floating gate of the select transistor may not have a floating gate-isolating region. It suffices if the formulas (3) and (4) are satisfied.

The above-described third embodiment can provide the select transistor with a desired threshold voltage without a writing process. In other words, the select transistor is set to have a desired threshold voltage after the erasing process using ultraviolet rays before the assembling process. As regards ultraviolet radiation, for example, ultraviolet rays with a wavelength λ of 2537 Å and with 3 mW/cm$^2$ are radiated for more than 10 min. At the time of rewriting data by the user, Vpp or Vm is applied to the select transistor during erasing of data so as to prevent the charge of the transistor from disappearing. Since in this case, no writing means for writing data into the select transistor is necessary, the row sub-decoder corresponding to FIG. 16 has a general structure as shown in FIG. 27. FIG. 28 shows examples of voltages applied to elements, which determine the operation of the circuit.

Although the invention has been explained with reference to the first through third embodiments, it is not limited to them, but may be modified in various manners without departing from the scope thereof. For example, the embodiments employ the NAND type EEPROM. However, in the case of a FLOTOX type EEPROM, too, the same advantage as described above can be achieved by constructing such that the select transistor has a floating gate electrode and the gate oxide film is formed of a tunnel oxide film. In other words, the step which may cause contamination can be omitted as a result of forming a commonly-used transistor structure and thus simplifying the manufacturing process, and the degree of integration can be increased as a result of reducing the number of contacts.

In addition, each memory cell performs data programming by charging or discharging a trap in its silicon nitride film with or of electricity, which memory cell has an MNOS structure in which its gate electrode is formed on a lamination type insulating film provided on a semiconductor substrate and consisting of a thin gate oxide film and the silicon nitride film, or has an MONOS structure in which its gate electrode is formed on a lamination type insulating film provided on a semiconductor substrate and consisting of a thin gate oxide film, the silicon nitride film and a thin oxide film. Even in the case of an EEPROM with the MNOS or MONOS structure, the same advantage as described above can be obtained by imparting the MNOS or MONOS structure to each select transistor, if employed.

Figure 29:
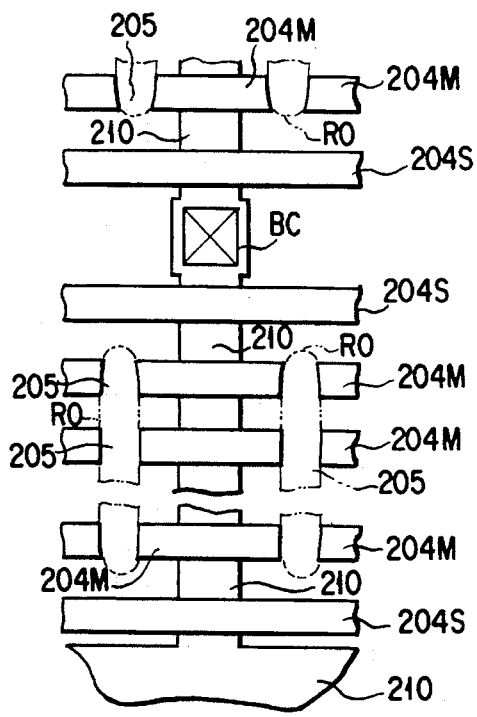
FIGS. 29 and 30 are plan views, useful in explaining secondary advantages obtained from the first embodiment.
Figure 30:
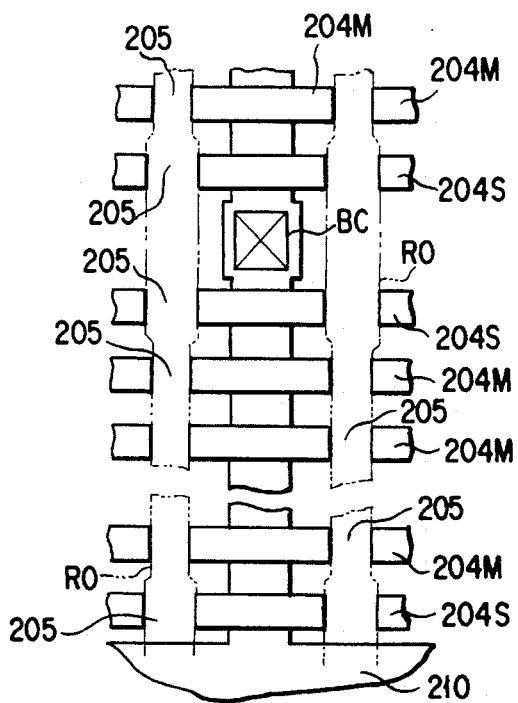

A secondary advantage resulting from the first embodiment will be explained. FIGS. 29 and 30 are plan views, showing the floating gate polysilicon film 204S of each select transistor, the floating gate polysilicon film 204M of each memory cell, a source/drain region 210, a bit line contact BC, and openings RO formed in a resist film. In the field of fine working, the resist film to be used as a mask for etching inevitably has round corners due to a limitation on resolution achieved by the photolithography technique. In the case of providing the floating gate-isolating regions 205 only in each memory cell, the regions 205 of a memory cell located adjacent to a select transistor may be deformed as a result of being influenced by the round resist film corners, as is shown in FIG. 29. If deformed, the coupling ratios of memory cells located adjacent to select transistors differ from each other. On the other hand, since in the first embodiment, the isolating regions 205 extend also through the select transistors as shown in FIG. 30, the regions 205 of the memory cells adjacent to the select transistors will hardly be deformed due to the influence of the configuration of the resist film. Accordingly, the coupling ratios of the memory cells little differ from each other.

Figure 31:
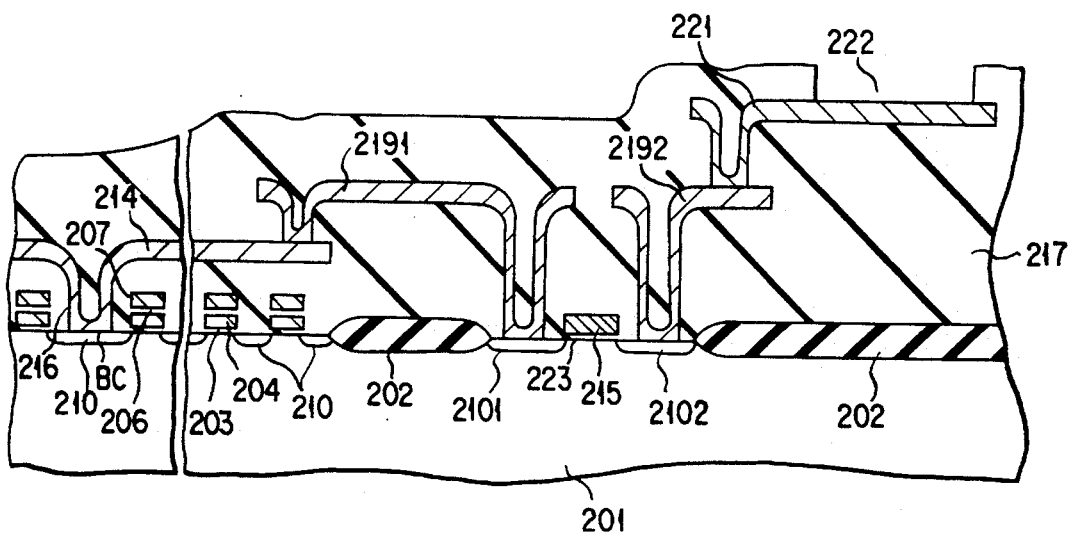
FIG. 31 is a cross sectional view, showing an example in which a wire functioning as a bit line in FIG. 9 is connected to a bonding pad.

FIG. 31 is a cross sectional view, showing an example of the wire 214 shown in FIG. 9 which serves as a bit line and is connected to a bonding pad. The bit line contact BC shown in FIG. 27 is also shown in FIG. 31. There are provided on the semiconductor substrate 201, the element isolating films 202, the gate oxide film 203, the floating gate polysilicon film 204, an insulating film (e.g. the ONO film 206) and the control gate polysilicon film 207. The diffusion layer 210 is connected to the wire (bit line) 214, which extends as a first wire layer through a contact hole 216. A gate insulating film 223 on the semiconductor substrate 201, a gate electrode 215 on the film 223 and diffusion layers 2101 and 2102 constitute a transistor as a peripheral circuit. The diffusion layer 2101 is connected to the wire 214 by means of a wire 2191, which extends as a second wire layer through a contact hole. Further, the diffusion layer 2102 is connected to the wire 2192, which is connected to a wire 221 extending, as a third wire layer, through a contact hole. The wire 221 is exposed through an opening 222 in a predetermined region of an interlayer insulating film 217. Thus, the wiring has a lamination structure consisting of a plurality of metal electrode wire layers and insulating films, and a plurality of contact holes must be formed for connecting the metal electrodes. Although FIG. 31 shows wiring of a three-layer structure, the wiring is not limited to this, but may have a structure of more than three layers, of two layers, or of a single layer.

FIG. 32 shows an applied example of the invention, specifically, a sense circuit having a verify function of a forcibly inverted type. In this example, explanation will be given only of three bit lines for easy understanding. As is shown in FIG. 32, the sense circuit comprises a memory cell array 11 including memory cells as shown in FIG. 13, a circuit 12 having a sense circuit of a forcibly inverted type and a writing data latch, a verify detection circuit 13, a column gate circuit 14, and a control circuit 15.

As is shown in FIG. 32, a circuit for a single bit line is constructed as follows: A plurality of NAND type memory cells 2-x (x=1–3) as shown in FIG. 13 are connected to each bit line BLx (x=1–3). A P-channel transistor Q1 is provided for charging the bit line BL. A flip-flop circuit 1-x (x=1–3) for temporarily storing writing data has a node Nx (x=1–3)

and a node BNx (x=1–3). An N-channel transistor Q2 is interposed between the node N of the flip-flop circuit 1-x and the bit line BLx for electrically connecting or disconnecting them. N-channel transistors Q3 and Q4 are connected in series between the node BNx of the flip-flop circuit 1-x and a ground potential of 0 V. The gate of the transistor Q3 is connected to the bit line BL. The transistors Q3 and Q4 constitute forcibly inverting means (data setting circuit). An N-channel transistor Q5 having a reset function is interposed between the node Nx and the ground potential of 0 V. An N-channel transistor Q6 having its gate connected to the node BNx has a function for detecting the termination of a verify operation. The transistor Q6 has its source grounded and its drain connected to a common verify line VL. A P-channel transistor Q7 is connected between the verify line VL and a power source for charging the verify line VL. A verify detection signal VFY is output through the verify line VL via an inverter 3. Each terminal of the flip-flop circuit 1-x is connected to an I/O line and a BI/O line (an inversion signal line of I/O) via a column gate 4.

A signal line φ1 is connected to the gate of each transistor Q1, and a signal line φ2 is connected to the gate of each transistor Q2, and a signal line φ3 is connected to the gate of each transistor Q3. A signal line φR is connected to the gate of the resetting transistor Q5, and a signal line φ4 is connected to the gate of the transistor Q7. The clock generating circuit 15 outputs clock signals φ1, φ2, φ3, φ4 and φR at predetermined time points. 10 V is applied to the source of the transistor Q1 during writing, and 5 V is applied to the same during the operations other than writing. Similarly, the flip-flop circuit is supplied with 10 V during writing and with 5 V during the operations other than writing.

The operation of the sense circuit constructed as above will be explained. Before reading the bit line potential, the transistor Q5 is turned on by the clock signal φR, to thereby initialize the flip-flop circuit 1-x (i.e., to set the node Nx to "L" level). Then, the bit line BLx is precharged with the clock signal φ1. The transistor Q2 is turned on by the clock signal φ2, causing the bit line to be in a free running state. After a predetermined time period elapses, the transistor Q4 is turned on by the clock signal φ3. If the bit line has a potential of "L" level, the flip-flop circuit 1-x is kept in the initial state, whereas if the bit line has a potential of "H" level, the state of the flip-flop circuit is inverted, resetting the level of the node BNx from "H" to "L".

Explanations will be given of a case (A) where the node N is set to "L", and data "0" is written into a selected cell, and of a case (B) where the node N is set to "H", and data "1" is written into a selected cell, in other words, the cell is kept in an erased state.

Referring first to the case (A), in the reading operation at the next occasion of verification, when a predetermined time period (a free running period) has elapsed after precharging the bit line by turning off the transistor Q2 and turning on the transistor Q1, it is considered that cells assume the following states (i) and (ii):

(i) A cell which has been supplied with a threshold voltage as data "0" in a reliable manner keeps the precharged potential of the bit line.

(ii) A cell which has not sufficiently been supplied with a threshold voltage, i.e., which has not received a sufficient amount of electrons, is nearly in the On-state and hence discharges the precharged potential of the bit line.

After the free running period, the transistor Q4 is turned on by the clock signal φ3.

If the cell assumes the state (i), the level of the node BNx of the flip-flop circuit 1-x becomes "L", and the latch data is inverted. As a result, the selected cell connected to the bit line is inhibited from performing the next rewriting operation, since the level of the node Nx assumes "H" in the next occasion of rewriting and an intermediate voltage (Vm=10 V) is applied to the bit line to prevent writing.

If the cell assumes the state (ii), the transistor Q3 is not turned on to keep the level of the node Nx at "L", next rewriting can be performed. The operation of rewriting is repeated at the time of verification until the cell assumes the state (i).

On the other hand, under the writing conditions of (B), the bit line necessarily assumes a discharge state, and therefore the transistor Q3 is not turned on, keeping the level of the node Nx at "H". In the next occasion of rewriting, the intermediate voltage is applied to the bit line for preventing writing. In other words, the bit line connected to the node Nx of the "H" level disables writing.

After the termination of the verify operation for a predetermined time period, the level of the clock signal φ4 is lowered to precharge the common verify line VL with 5 V. If at least one of the transistors Q6-1, Q6-2 and Q6-3 is in the On-state, the common verify line VL is discharged. If all the transistors Q6-1–Q6-3 are in the Off-state and non-conductive, the common verify line VL is kept at 5 V. Accordingly, if there is at least one bit line which is connected to the node Nx of 0 V (i.e., which has not completed writing), the common verify line VL is discharged and the output verify detection signal VFY is at 5 V. Further, if all the nodes N1–N3 are set at 5 V after verification (i.e., if writing has been completed through all the bit lines), the common verify line VL is kept at 5 V, and the output signal VFY is at 0 V.

As explained above, by virtue of a batch verify processing circuit, it can be detected in a batch manner whether or not writing has been completed through all the bit lines. As a result, it can be determined when the cycle of the writing operation or of the verify operation should be ceased. The time point at which the common verify line VL is charged by the clock signal φ4 can be set during or before reading for verify, which contributes to the shortening of the time required for batch verify processing time or writing. The sense circuit having such verify means can be used to perform verification after the writing by the select transistor in the first or second embodiment.

The manufacturing methods employed in the above embodiments are only examples, and can be modified in various manners within a range in which the advantage of the invention can be achieved. Although, for instance, the embodiments employ a tunnel oxide film with a thickness of 10 nm, the film thickness is not limited to 10 nm but varies depending upon the value of Vpp or the coupling ratio, since the electric field applied to the tunnel oxide film is determined as a result of potential division due to the electrostatic capacities above and below the floating gate when Vpp is applied to the control gate electrode.

Moreover, no definitions are given to the semiconductor substrate in the embodiments. A P-type silicon substrate or an N-type silicon substrate may be used. In the case of forming an N-type MOS memory cell, a P-type well is formed in a P-type or N-type substrate, so as to cause the substrate surface of the memory cell-forming region to be of P-type. On the other hand, in the case of forming a P-type MOS memory cell, an N-type well is formed in a P-type or N-type substrate, so as to cause the substrate surface of the memory cell-forming region to be of N-type.

Furthermore, although a thermal oxide film is used as the tunnel oxide film in the embodiments, the forming conditions are not limited to the above-described ones, and an insulating film such as a nitride oxide film may be used in place of the thermal oxide film. The insulating film on the floating gate electrode is not limited to the ONO lamination layer, but may be formed of a single-layer oxide film. The method of the ONO layer is not limited to thermal oxidation, but may be the CVD method. The material of the control gate electrode is not limited to polysilicon, but may be a lamination film of polysilicon and silicide or a silicide single layer. Although in the embodiments, the metal wiring layer is formed of an aluminum alloy, it may be formed of a silicide single layer (such as a WSi layer) or of a lamination layer of polysilicon and silicide.

In addition, although in the embodiments, an aluminum alloy is deposited after forming a contact hole, a barrier metal layer of a metal other than aluminum may be formed before the deposition of the aluminum alloy. Further, the contact hole may be filled with silicon or a metal.

As explained above, an electrically programmable non-volatile semiconductor memory device according to each embodiment of the invention employs a select transistor having no contact holes in the first polysilicon film, i.e., a select transistor with a small number of contact holes and hence with no contact fringe. Therefore, the invention can provide a non-volatile semiconductor memory device having a reliable tunnel oxide film, and also a method for manufacturing the device in a simple manner.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising:

memory cell means for storing data, which has a source/drain region formed in a surface portion of a semiconductor substrate, a first control gate electrode formed on the source/drain region, and a first charge-accumulating region formed between the first control gate electrode and the semiconductor substrate, the first charge-accumulating region being charged with electricity in a writing mode as a result of a difference in potential between the first control gate electrode and the semiconductor substrate and between the first control gate electrode and the source/drain region, thereby setting the threshold voltage of the memory cell means to a value higher than a voltage applied to the first control gate electrode in a reading mode, the first charge-accumulating region being discharged of electricity in an erasing mode as a result of a difference in potential reverse to that in the writing mode, thereby setting the threshold voltage of the memory cell means to a value lower than the voltage applied to the first control gate electrode in the reading mode; and select transistor means having a second control gate electrode located at an end portion of the memory cell means, and a second charge-accumulating region similar to the first charge-accumulating region and located between the second control gate electrode and the semiconductor substrate, the select transistor means having a positive threshold voltage at least in the reading mode and the writing mode for the memory cell means.

2. The device according to claim 1, wherein the second charge-accumulating region of the select transistor means is charged with a predetermined amount of electricity.

3. The device according to claim 1, wherein the select transistor means has a neutral positive threshold voltage as a result of radiation of ultraviolet rays at least onto the second charge-accumulating region.

4. The device according to claim 3, wherein the select transistor means has a channel region doped with an impurity.

5. The device according to any one of claims 2–4, wherein gate insulating films having substantially the same thickness are formed between the second charge-accumulating region of the select transistor and the semiconductor substrate and between the first charge-accumulating region of the memory cell means and the semiconductor substrate.

6. The device according to any one of claims 2–4, further comprising means located between the second charge-accumulating region of the select transistor means and the semiconductor substrate, for applying an electric field of such a low intensity as can keep the positive threshold voltage during the erasing mode for the memory cell means.

7. The device according to claim 6, wherein the first charge-accumulating region is a first floating gate electrode formed on the gate insulating film, the second charge-accumulating region is a second floating gate electrode formed on the gate insulating film, a first insulating film is formed between the first floating gate electrode and the first control gate electrode, and a second insulating film is formed between the second floating gate electrode and the second control gate electrode.

8. The device according to claim 7, wherein the first and second insulating films are lamination type insulating films having substantially the same structure.

9. The device according to claim 7, wherein the ratio, in the select transistor means, of an electrostatic capacitance between the second floating gate and the second control gate to the sum of the electrostatic capacitance and an electrostatic capacitance between the second floating gate and the semiconductor substrate is lower than the ratio, in the memory cell means, of an electrostatic capacitance between the first floating gate and the first control gate to the sum of the electrostatic capacitance and an electrostatic capacitance between the first floating gate and the semiconductor substrate.

10. The device according to claim 9, wherein pairs of the memory cell means and the select transistor means are arranged in a direction in which the first and second control gates extend with an element-isolating region interposed between each adjacent two of the pairs; the first floating gate electrodes are arranged in the same direction as the first control gates with the element-isolating region interposed between each adjacent two of the first floating gate electrodes, each of the first floating gate electrodes being provided in a corresponding one of the memory cell means; the second floating gate electrodes are arranged in the same direction as the second control gates with the element-isolating region interposed between each adjacent two of the second floating gate electrodes, each of the second floating gate electrodes being provided in a corresponding one of the select transistor means; and the length of the second floating gate electrode in the direction of the extension of the second control gate electrodes is shorter than the length of the first floating gate electrode in the direction of the extension of the first control gate electrodes.

11. The device according to claim 9, wherein pairs of the memory cell means and the select transistor means are arranged in a direction in which the first and second control gates extend with an element-isolating region interposed between each adjacent two of the pairs; the first floating gate electrodes are arranged in the same direction as the first control gates, with the element-isolating region interposed between each adjacent two of the first floating gate electrodes, a distance between each adjacent two of the first floating gate electrodes being a predetermined length which is shorter than two times the thickness of the first floating gate electrode; and the second floating gate electrode extends continuously in the same direction as the second control gates on the element-isolating regions interposed between the select transistor means.

12. The device according to claim 10 or 11, further comprising bit line means connected to a predetermined one of the select transistor means, and wherein each pair of the memory cell means and the select transistor means has a unit structure, in which the memory cell means has a series circuit including source/drain regions connected in series and hence has channel regions located below the first floating gates and connected in series, and the select transistor means are provided at opposite ends of the series circuit of the memory cell means, respectively.

13. The device according to claim 12, wherein the unit structure are arranged in the form of a matrix, and have verify means for correcting that threshold voltage of the memory cell means which relates to data writing.

14. The device according to claim 13, wherein the verify means comprises:

flip-flop circuit means for determining whether data read from or written into the memory cell means is in a first state or a second state and holding the determined data in a predetermined holding node;

charge means for precharging the bit line means in a verify mode for the memory cell means;

connecting means for connecting the flip-flop circuit means to the bit line means, the connecting means electrically disconnecting, for a predetermined time period, the bit line means from the flip-flop circuit means in the verify mode for the memory cell means;

a first verifying transistor to be conductive in the verify mode, and a second verifying transistor having a gate controlled in response to a signal from the bit line means; and circuit means for constituting a current path which allows the first and second verifying transistors to invert data held by the predetermined holding node of the flip-flop circuit means at the time of the termination of the verify mode.

15. The device according to claim 14, wherein the flip-flop circuit means includes reset means.

16. The device according to claim 14, further comprising verify detection means for detecting the termination of the verify mode.

17. The device according to claim 16, wherein the verify detection means has a common verify line for passing therethrough a detection signal only when the predetermined holding nodes of all the flip-flop circuit means have the same data.

18. The device according to claim 1, wherein the memory cell means uses a Fowler-Nordheim tunnel current at the time of writing data therein.

19. The device according to claim 18, wherein the memory cell means is formed of a NAND type flash memory.

20. A semiconductor memory device, comprising:

a first conductive wiring layer;

a first memory cell; and a first select transistor connected between said first conductive wiring layer and said first memory cell, said first select transistor including a charge accumulating region and a control gate which is electrically insulated from said charge accumulating region.

21. The device according to claim 20, wherein said first conductive wiring layer is a bit line.

22. The device according to claim 20, wherein said first memory cell is selectable for data reading, and said first select transistor is conductive when said first memory cell is selected for data reading to thereby electrically connect said first memory cell and said first conductive wiring layer.

23. The device according to claim 20, wherein said first memory cell is selectable for data writing, and said first select transistor is conductive when said first memory cell is selected for data writing to thereby electrically connect said first memory cell and said first conductive wiring layer.

24. The device according to claim 20, wherein said first memory cell is selectable for data writing, and said first select transistor is non-conductive when said first memory cell is selected for data writing to thereby electrically disconnect said first memory cell and said first conductive wiring layer.

25. The device according to claim 20, wherein said first memory cell is selectable for data erasing, and said first select transistor is conductive when said first memory cell is selected for data erasing to thereby electrically connect said first memory cell and said first conductive wiring layer.

26. The device according to claim 20, wherein said first memory cell includes a floating gate and said charge accumulating region of said first select transistor is a floating gate.

27. The device according to claim 26, wherein said floating gate of said first select transistor is doped with an impurity having a concentration of $5 \times 10^{19} - 2 \times 10^{20}$ cm$^{-3}$.

28. The device according to claim 26, wherein said floating gate of said first select transistor is shorter than said floating gate of said first memory cell.

29. The device according to claim 26, wherein said floating gate of said first select transistor and said floating gate of said first memory cell are insulatively spaced from a semiconductor substrate by respective gate insulating films having the same thickness.

30. The device according to claim 20, wherein said first select transistor has a positive neutral threshold voltage.

31. The device according to claim 30, wherein the positive neutral threshold voltage is about 1 V.

32. The device according to claim 20, wherein said first select transistor has a positive neutral threshold voltage as a result of radiation of ultraviolet rays at least onto said charge accumulating region.

33. The device according to claim 32, wherein said first select transistor further includes a channel region doped with an impurity.

34. The device according to claim 20, further comprising:

a second conductive wiring layer;

a second memory cell; and a second select transistor connected between said second conductive wiring layer and said second memory cell, said second select transistor including a charge accumulating region and a control gate which is electrically insulated from said charge accumulating region.

35. The device according to claim 34, wherein said second memory cell includes a floating gate and said charge accumulating region of said second select transistor is a floating gate.

36. The device according to claim 35, wherein said floating gate of said second select transistor is electrically connected to said floating gate of said first select transistor.

37. The device according to claim 34, wherein said first and second conductive wiring layers are first and second bit lines.

38. The device according to claim 20, further comprising:
   writing circuitry for writing data to said first select transistor such that said first select transistor has a positive threshold voltage when data is read from or written to said first memory cell.

39. The device according to claim 38, wherein said first memory cell is selectable for data reading or writing, and said first select transistor is conductive when said first memory cell is selected for data reading or writing and is non-conductive when said first memory cell is not selected for data reading or writing.

40. The device according to claim 20, further comprising:
   erasing circuitry for erasing said first memory cell, but not said first select transistor.

41. The device according to claim 20, wherein said first memory cell is a non-volatile memory cell.

42. The device according to claim 20, wherein said semiconductor memory device is a NAND-type electrically erasable programmable read only memory.

43. The device according to claim 20, wherein said semiconductor memory device is a floating gate tunnel oxide-type electrically erasable programmable read only memory.

44. A semiconductor memory device, comprising:
   first and second conductive wiring layers;
   first and second memory cells;
   a first select transistor connected between said first conductive wiring layer and said first memory cell, said first select transistor including a charge accumulating region and a control gate which is electrically insulated from said charge accumulating region; and
   a second select transistor connected between said second conductive wiring layer and said second memory cell, said second select transistor comprising a charge accumulating region and a control gate which is electrically insulated from said charge accumulating region,
   wherein said charge accumulating region of said first select transistor is electrically connected to said charge accumulating region of said second select transistor.

45. The device according to claim 44, wherein said charge accumulating region of said first select transistor and said charge accumulating region of said second select transistor are floating gates formed of a same conductive layer.

46. The device according to claim 44, wherein said first and second select transistors each has a positive neutral threshold voltage.

47. The device according to claim 44, wherein said first and second select transistors have positive threshold voltages when dam is read from or written to said first and second memory cells.

48. A semiconductor memory device, comprising:
   a conductive wiring layer;
   a circuit unit including at least two memory cells connected in series; and
   a select transistor connected between said conductive wiring layer and said circuit unit, said select transistor including a charge accumulating region and a control gate which is electrically insulated from said charge accumulating region.

49. The device according to claim 48, wherein said at least two memory cells are floating gate-type memory cells and said charge accumulating region of said first select transistor is a floating gate.

50. The device according to claim 49, wherein said floating gate of said first select transistor is shorter in length than said floating gates of said at least two memory cells.

51. The device according to claim 48, wherein said select transistor has a positive neutral threshold voltage.

52. The device according to claim 48, further comprising:
   writing circuitry for writing dam to said select transistor such that said select transistor has a positive threshold voltage when data is read from or written to said circuit unit.

* * * * *